(12) United States Patent
Gudeman et al.

(10) Patent No.: US 7,294,449 B1
(45) Date of Patent: Nov. 13, 2007

(54) RADIATION PATTERNABLE FUNCTIONAL MATERIALS, METHODS OF THEIR USE, AND STRUCTURES FORMED THEREFROM

(75) Inventors: Christopher Gudeman, Los Gatos, CA (US); Joerg Rockenberger, Redwood City, CA (US); Brian Hubert, Mountain View, CA (US); Criswell Choi, Menlo Park, CA (US); Alfred Renaldo, San Jose, CA (US)

(73) Assignee: Kovio, Inc., Sunnyvale, CA (US)

( * ) Notice: Subject to any disclaimer, the term of this patent is extended or adjusted under 35 U.S.C. 154(b) by 0 days.

(21) Appl. No.: 10/749,876

(22) Filed: Dec. 31, 2003

(51) Int. Cl.
*G03F 7/00* (2006.01)
*G03F 7/004* (2006.01)

(52) U.S. Cl. .................................. 430/270.1
(58) Field of Classification Search .............. 430/270.1
See application file for complete search history.

(56) References Cited

U.S. PATENT DOCUMENTS

| | | |
|---|---|---|
| 3,925,578 A | 12/1975 | Polichette et al. |
| 4,133,908 A | 1/1979 | Madsen |
| 4,167,601 A | 9/1979 | Beckenbaugh et al. |
| 4,181,750 A | 1/1980 | Beckenbaugh et al. |
| 4,192,764 A | 3/1980 | Madsen |
| 4,268,536 A | 5/1981 | Beckenbaugh et al. |
| 4,327,124 A | 4/1982 | DesMarais, Jr. |
| 4,404,237 A | 9/1983 | Eichelberger et al. |
| 4,470,883 A | 9/1984 | Eichelberger et al. |
| 4,526,807 A | 7/1985 | Auerbach |
| 4,569,953 A | 2/1986 | West et al. |

(Continued)

FOREIGN PATENT DOCUMENTS

| | | |
|---|---|---|
| EP | 1 526 584 A2 | 4/2005 |
| JP | 7-267621 | 10/1995 |
| WO | WO 00/59041 | 10/2000 |

OTHER PUBLICATIONS

Avey et al.; Solid State Photochemistry . . . ; Journal of the American Chemical Society; Jan. 10, 1996; 2 pages; vol. 118, No. 1; American Chemical Society, Washington, D.C.

(Continued)

*Primary Examiner*—Amanda C. Walke
(74) *Attorney, Agent, or Firm*—Andrew D. Fortney

(57) ABSTRACT

Materials, compounds and compositions for radiation patternable functional thin films, methods of synthesizing such materials and compounds, and methods for forming an electronically functional thin film and structures including such a film. The compounds and compositions generally include (a) nanoparticles of an electronically functional material or substance and (b) ligands containing a (photo) reactive group. The method generally includes the steps of (1) irradiating the compound and/or composition, and (2) curing the irradiated compound and/or composition, generally to form an electronically functional film. The functional thin film includes a sintered mixture of nanoparticles. The thin film exhibits improved morphology and/or resolution relative to an otherwise identical structure made by an identical process, but without the (photo)functional group on the ligand, and/or relative to an otherwise identical material patterned by a conventional graphics art-based printing process. The present process also exhibits improved throughput relative to conventional photolithographic processing, by eliminating a metal deposition step. The present invention advantageously provides functional thin film structures having qualities suitable for use in electronics applications, such as display devices or RF ID tags, while enabling elimination of a number of conventional photolithographic processing steps (e.g., functional material sputtering, PECVD, etc.).

100 Claims, 6 Drawing Sheets

U.S. PATENT DOCUMENTS

| | | | |
|---|---|---|---|
| 4,666,735 | A | 5/1987 | Hoover et al. |
| 5,032,478 | A | 7/1991 | Nebe et al. |
| 5,032,488 | A | 7/1991 | Finter |
| 5,032,490 | A | 7/1991 | Nebe et al. |
| 5,139,818 | A | 8/1992 | Mance |
| 5,378,508 | A | 1/1995 | Castro et al. |
| 5,534,312 | A | 7/1996 | Hill et al. |
| 5,635,338 | A | 6/1997 | Joshi et al. |
| 5,859,085 | A | 1/1999 | Hodko et al. |
| 5,874,197 | A | 2/1999 | Felten |
| 5,942,376 | A | 8/1999 | Uchida et al. |
| 6,022,596 | A | 2/2000 | Baum et al. |
| 6,071,676 | A | 6/2000 | Thomson et al. |
| 6,153,348 | A | 11/2000 | Kydd et al. |
| 6,200,646 | B1 | 3/2001 | Neckers et al. |
| 6,204,515 | B1 | 3/2001 | Bernius et al. |
| 6,218,278 | B1 | 4/2001 | Gurovich et al. |
| 6,315,927 | B1 | 11/2001 | Kubota et al. |
| 6,348,295 | B1 | 2/2002 | Griffith et al. |
| 6,387,012 | B1 | 5/2002 | Mitamura |
| 6,413,790 | B1 | 7/2002 | Duthaler et al. |
| 6,458,431 | B2 | 10/2002 | Hill et al. |
| 6,521,489 | B2 | 2/2003 | Duthaler et al. |
| 6,524,663 | B1 | 2/2003 | Kelly et al. |
| 6,534,235 | B1 | 3/2003 | Hanabata et al. |
| 6,558,874 | B2 | 5/2003 | Drozdyk |
| 6,566,276 | B2 | 5/2003 | Maloney et al. |
| 6,753,245 | B2 | 6/2004 | Choi |
| 6,767,775 | B1 | 7/2004 | Yudasaka et al. |
| 6,921,623 | B2 * | 7/2005 | Hanabata et al. ........ 430/270.1 |
| 2003/0073042 | A1 | 4/2003 | Cernigliaro et al. |
| 2005/0145163 | A1 | 7/2005 | Matsuki et al. |
| 2005/0176183 | A1 | 8/2005 | Aoki |

OTHER PUBLICATIONS

Ching et al.; Photolithographic Deposition of Indium Oxide from Metalorganic Films; J. Vac. Sci. Technol. A, vol. 16, No. 2, Mar./Apr. 1998; pp. 897-901; American Vacuum Society.

Mance; High-Resolution Electroless Deposits on Alumina from Ultraviolet Exposure of a Pt Metalorganic; Appl. Phys. Lett. 60 (19), May 11, 1992, pp. 2350-2352; American Institute of Physics.

Bravo-Vasquez et al.; Photolithographic Deposition of Conducting Gold Films from Thin Amorphous Films . . . ; Polyhedron 19 (2000) 343-349; Pergamon Press.

Buono-Core et al.; Solid-State Photochemistry of a Cu(II) B-Diketonate Complex: The Photochemical Formation of High Quality Films of Copper(II) Oxide; Materials Research Bulletin, vol. 34, No. 14/15, pp. 2333-2340, 1999; Pergamon Press.

Vossmeyer et al.; Combinatorial Approaches Toward Patterning Nanocrystals; Journal of Applied Physics; Oct. 1, 1998; pp. 3664-3670; vol. 84, No. 7; American Institute of Physics.

Kotaro Yano, Yutaka Kitsuno, Akira Sakawaki, Kolji Kawasaki; Formation of Silicon Membrane; Patent Abstracts of Japan; Publication Date: Oct. 17, 1995; Publication No. JP 07267621 A; Japanese Patent Office, Japan.

* cited by examiner

RADIATION PATTERNABLE FUNCTIONAL MATERIALS, METHODS OF THEIR USE, AND STRUCTURES FORMED THEREFROM

RELATED APPLICATION(S)

The present application may be related to U.S. application Ser. No. 10/616,147, filed Jul. 8, 2003 and entitled "Compositions and Methods for Forming a Semiconducting and/or Silicon-Containing Film, and Structures Formed Therefrom", which is incorporated herein by reference in its entirety.

FIELD OF THE INVENTION

The present invention generally relates to the field of radiation patternable functional materials. More specifically, embodiments of the present invention pertain to radiation patternable functional compounds and materials, compositions including such compounds and materials, methods for making such compounds and materials, methods of using such compounds and materials to make a thin film, and patterned structures including such a thin film.

SUMMARY OF THE INVENTION

Embodiments of the present invention relate to radiation-definable functional thin films and to compounds, materials, compositions and methods for making such thin films and to methods of making or synthesizing such compounds and/or materials. The radiation patternable functional material generally comprises (i) nanoparticles of an electronically functional substance; and (ii) a plurality of ligands bound to each of the nanoparticles, the ligands containing a photoreactive group or a group that is reactive with a photochemically generated species and that, after a first-order photoreaction or reacting with the photochemically generated species, materially changes the solubility characteristics of the material in a developer. Alternatively, the present invention concerns a compound of the formula (1):

$$(R^1-X^1)_m NP(X^2-R^2-Y)_n \quad (1)$$

where NP comprises a nanoparticle of an electronically functional substance; Y is a group that is photoreactive or that is reactive with a photochemically generated species and which, after first-order photoreaction or reacting with the photochemically generated species, materially changes the solubility characteristics of the compound in a developer; $X^1$ and $X^2$ are independently a nanoparticle-binding group; $R^1$ is a monovalent group that is not reactive with the photochemically generated species; $R^2$ is a divalent bridging group; m is at least 0, and the m instances of $R^1-X^1$ may be the same or different; and n is at least 1, and the n instances of $X^2-R^2-Y$ may be the same or different.

The compositions generally comprise (a) the above-described nanoparticles; and (b) a solvent in which the nanoparticle-based material or compound is soluble. In preferred embodiments, the composition further comprises (i) a source of the photochemically generated species that materially changes the solubility of the material(s) and/or compound(s) in a developer after irradiation of the composition; and/or (ii) a binder to improve adherence of the thin film to a substrate.

The invention further relates to methods of synthesizing the present materials and compounds, generally in accordance with one or more of four reaction types: (i) ligand exchange; (ii) micelle formation; (iii) ligand modification; and (iv) addition of a functional group or functional group component to the ligand. In a further aspect, the invention relates to methods of making and/or forming an electronically functional thin film, comprising the steps of irradiating the present composition; and curing the irradiated composition to form the electronically functional thin film. Typically, the irradiating step comprises selectively irradiating portions of the composition.

The structures generally comprise a pattern of an electronically functional material on a substrate, the electronically functional material comprising sintered, photodefined nanoparticles of an electronically functional substance and having, prior to photodefinition and sintering, a ligand containing a group that is reactive with a photochemically generated species and which, after reacting with the photochemically generated species, materially changes the solubility characteristics of the nanoparticles in a developer.

The present invention advantageously provides thin film structures having improved physical and/or electrical properties (e.g., film uniformity, film morphology and/or feature resolution), relative to structures made from nanoparticles without the (photo)reactive group or from printed nanoparticle inks. Direct photolithographic processing of electronically functional materials provides numerous advantages over prior methods. For example, direct photolithographic processing avoids a number of processing steps in conventional photolithographic processing, such as photoresist application, photoresist patterning, functional material etching and photoresist removal, that can adversely affect resolution, yield and throughput rates. Alternatively, if one views a material that can be directly photodefined as having a "built-in" photoresist, one can avoid conventional functional material deposition steps, such as sputtering, PECVD, etc. Furthermore, direct photolithographic processing generally provides higher pattern resolution and film quality than conventional graphic arts printing processes. The present composition advantageously provides conducting, semiconducting and insulating thin film structures having qualities suitable for use in electronics applications, such as display devices or RF ID tags, while enabling high-throughput, high-resolution, high-quality, high-yield photolithographic processes to be used for manufacturing such electronic devices.

These and other advantages of the present invention will become readily apparent from the detailed description of preferred embodiments below.

DETAILED DESCRIPTION OF THE PREFERRED EMBODIMENTS

Figure 1B:
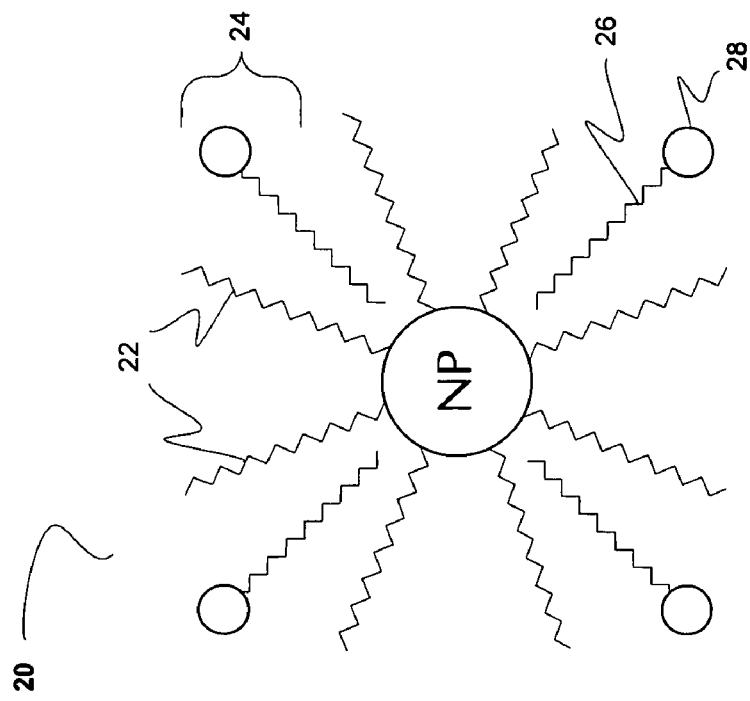
FIGS. 1A-1B show embodiments of the present radiation patternable functional materials.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

For the sake of convenience and simplicity, the phrase "photoreactive group" refers to a group that is itself photoreactive; the phrase "reactive group" refers to a group that is not itself photoreactive, but that is reactive with a photochemically generated species (i.e., a species generated directly or indirectly from a photoreactive group); and the phrase "(photo)reactive group" refers to a group that is photoreactive or that is reactive with a photochemically generated species. Furthermore, the following groups of terms (and grammatical variants thereof) may be used somewhat interchangeably, but the individual terms are generally given their art-recognized meanings:

"material," "substance," "composition," and "ink";
"patternable" and "definable";
"making," "synthesizing," "reacting" or "creating";
"nanoparticle" and "nanocrystal" (although the term "nanocrystal" generally refers to a single crystal particle of material having a diameter generally about 1-100 nm, and "nanoparticle" generally refers to single-crystalline or polycrystalline or amorphous particle of material of similar diameter); and
"radiation patternable" and "photodefinable."

The present invention concerns a radiation patternable functional material that generally comprises (i) nanoparticles of an electronically functional substance; and (ii) a plurality of ligands bound to each of the nanoparticles, the ligands containing a photoreactive group or a group that is reactive with a photochemically generated species and that, after first-order photoreaction or reacting with the photochemically generated species, materially changes the solubility characteristics of the material in a developer. Alternatively, the invention relates to a compound of the formula (1):

$(R^1-X^1)_m NP(X^2-R^2-Y)_n,$ (1)

where NP comprises a nanoparticle of an electronically functional substance; Y is a group that is photoreactive or that is reactive with a photochemically generated species and which, after first-order photoreaction or reacting with the photochemically generated species, materially changes the solubility characteristics of the compound in a developer; $X^1$ and $X^2$ are independently a nanoparticle-binding group; $R^1$ is a monovalent group that is not reactive with the photochemically generated species; $R^2$ is a divalent bridging group; m is at least 0, and the m instances of $R^1-X^1$ may be the same or different; and n is at least 1, and the n instances of $X^2-R^2-Y$ may be the same or different.

A further aspect of the invention concerns an ink composition for a radiation patternable, functional thin film, including the inventive material or compound described herein and a solvent in which the material or compound is soluble. The composition may further comprise a surface tension reducing agent, a surfactant, a binder, an additional photoreactive compound and/or a thickening agent.

An even further aspect of the invention concerns a method of making a patterned film, comprising the steps of: (a) irradiating a composition comprising at least a compound of the formula (1) above; and (b) developing and/or curing the irradiated composition to form the patterned film. Typically, the irradiating step comprises selectively irradiating portions of the composition. In most embodiments, the method comprises developing and curing the irradiated composition to form a patterned, electronically functional thin film.

The invention, in its various aspects, will be explained in greater detail below with regard to exemplary embodiments.

Exemplary Materials

In one aspect, the present invention relates to a radiation patternable functional material generally comprising (i) nanoparticles of an electronically functional substance; and (ii) a plurality of ligands bound to each of the nanoparticles, the ligands containing a photoreactive group or a group that is reactive with a photochemically generated species and that, after first-order photoreaction or reacting with the photochemically generated species, materially changes the solubility characteristics of the material in a developer. FIG. 1A shows an embodiment 10 of the present radiation patternable functional material, comprising nanoparticle core substance NP, nanoparticle-binding groups 12, monovalent ligands 14, divalent bridging groups 16 and photoreactive groups 18. The nanoparticle-binding groups 12, monovalent ligands 14, divalent bridging groups 16 and photoreactive groups 18 make up a nanoparticle passivation layer (although, in general, nanoparticle passivation layers are not limited to the embodiments shown in FIGS. 1A-1B and/or described herein).

The electronically functional substance of the nanoparticles may comprise a nanocrystalline metal, semiconductor, dielectric and/or phosphor. Nanocrystalline metals are generally single-element metals or metal alloys having high conductivity or other electromagnetically functional properties, such as a magnetic moment, low-temperature superconductivity, etc. Examples of suitable phosphors include indium tin oxide (ITO); ZnS and/or ZnO which may be doped with Cu, Ag, Au and/or Al; phosphides and/or nitrides of Al, In and/or Ga; oxides and/or sulfides of Y, Yb, Fe, Mg, Ca, Co and/or Al (which may be doped with Eu, Tb and/or Si); phosphates of La, Tb and/or Ce; and/or combinations thereof. Dielectrics may comprise an oxide, nitride, oxynitride, carbide or sulfide of a metal or metalloid, such as aluminum, silicon, germanium, tin, lead, indium, zinc, iron, manganese, chromium, molybdenum, tungsten, vanadium, tantalum, titanium, zirconium, and combinations thereof (e.g., silicon dioxide, silicon nitride, silicon oxynitride, silicon carbide, aluminum oxide, tantalum nitride [which may have electrically conductive properties, but which for the purposes of this application can be considered a "dielectric" material], etc.). Preferably, however, the electronically functional substance comprises or consists essentially of a metal or semiconductor (and more preferably, a nanocrystalline metal).

Examples of suitable semiconductors include silicon, germanium, a silicon-germanium mixture, CdS, CdSe, InP, InAs and GaAs. The semiconductor nanocrystals may be doped with one or more conventional dopants, such as B, P and As. In such an embodiment, when the silicon nanocrystals further include about 0.1 mol. % or less of a dopant, such nanocrystals may be said to consist essentially of silicon. Exemplary semiconducting nanoparticles are described in U.S. application Ser. No. 10/339,741, filed Jan. 9, 2003 and entitled "Nanoparticles and Method for Making the Same" and in U.S. application Ser. No. 10/616,147, filed Jul. 8, 2003 and entitled "Compositions and Methods for Forming a Semiconducting and/or Silicon-Containing Film, and Structures Formed Therefrom", both of which are incorporated herein by reference in their entireties. Preferred semiconductors include silicon and silicon-germanium mixtures.

Alternatively, the electronically functional substance may comprise one or more metals selected from transition metals, noble metals, aluminum, indium, tin, lead, and alloys thereof. The term "alloy" refers not only to alloys of such metals with each other but also with other conventional alloying elements, such as silicon, carbon, boron, phosphorous, nitrogen, etc. In preferred embodiments, the electronically functional substance comprises or consists essentially of one or more of the following metals: Cr, Mo, W, Fe, Ru, Ni, Pd, Pt, copper (Cu), silver (Ag), gold (Au), and aluminum (Al). More preferably, the electronically functional substance comprises nickel, copper, silver or gold. In one implementation, the electronically functional substance consists essentially of silver.

In preferred embodiments, the nanoparticles (preferably the nanocrystal cores) have an average diameter of less than 100 nm, preferably less than 10 nm, more preferably about or less than 5 nm. One embodiment including larger nanoparticles (e.g., having an average diameter of from 10 to 100 nm) may be advantageous because (i) an ink composition containing such nanoparticles may further include a reduced amount of surfactant, and/or (ii) a sintered nanoparticle thin film formed from nanoparticles of varying sizes may exhibit improved packing. Alternatively, the nanoparticles and/or nanocrystals may have a size distribution range such that at least 90% (preferably, at least 95% and more preferably, at least 98%) of the nanoparticles have a diameter of from 0.1 nm to 100 nm, preferably from 0.2 nm to 10 nm, more preferably from 0.5 nm to less than 5 mm.

The ligands of the present material may be bound to the nanoparticles by covalent, coordination, van der Waals and/or ionic bonds. For example, bonding between certain nanoparticle core materials and ligands, such as silicon nanocrystals and alkyl groups, may be characterized as covalent binding of the ligand to the nanoparticle core. Alternatively, bonding between other materials and ligands, such as silver nanocrystals and carboxylate groups, may be characterized as primarily ionic binding of the ligand to the nanoparticle core. Some ligands, such as alcoholates and thiolates, bind to nanoparticle core materials such as silver or silicon by a combination of covalent and ionic bonds. Finally, ligands such as phosphine-, amine-, ether- and ester-based surfactants tend to bind to nanoparticles comprising metals having d-orbitals by coordination bonds and/or by hydrogen bonding. However, in the case of nanoparticles having surfactant-based ligands, it can be challenging to synthesize materials such that (photo)reactive groups on the ligands do not undergo exchange reactions with the nanoparticle-binding groups of the surfactant. Thus, in preferred embodiments, the ligands may be bound to the nanoparticles through at least one nanoparticle-binding member selected from the group consisting of an alcoholate, a thiolate, a disulfide, a carboxylate, a carboxylic acid, an amine, a phosphine, a phosphine oxide and an alkyl group.

In the present material, the ligands may contain a group that is reactive with the photochemically generated species and that, after such a reaction, materially changes the solubility characteristics of the material in a developer. For example, the (photo)reactive group may be one or more of a carbon-carbon double bond, an epoxide, an oxirane, an aziridine, a phenol, a carbonate and a carbamate. When the (photo)reactive group comprises a carbon-carbon double bond, the carbon-carbon double bond may be a vinyl group, an activated carbon-carbon double bond, an acrylate, and/or a vinyl ketone. The term "vinyl group" generally encompasses groups of the formula —CR=CR'R", where R, R' and R" are independently H, $C_1$-$C_6$ alkyl or $C_2$-$C_6$ alkenyl (preferably H or $CH_3$). The term "activated carbon-carbon double bond" generally encompasses groups of the same formula, but where at least one of R, R' and R" is $C_1$-$C_6$ alkoxy, mono- or di-$C_1$-$C_6$ amino, a cyclic amino group, or $C_6$-$C_{10}$ aryl (which may be substituted one or more times with $C_1$-$C_6$ alkyl, $C_2$-$C_6$ alkenyl, $C_1$-$C_6$ alkoxy, mono- or di-$C_1$-$C_6$ amino or halogen, preferably $CH_3$, $CH_3O$, Cl or Br); preferred substituents on an "activated carbon-carbon double bond" include methoxy, phenyl, di-$C_2$-$C_4$ amino, and pyrrolidinyl. The term "acrylate" generally encompasses groups of the formula —CR=CR'R", where one of R, R' and R" is —C(=O)O—$C_1$-$C_6$ alkyl and the others are independently H or $C_1$-$C_6$ alkyl (preferably H or $CH_3$). The term "vinyl ketone" generally encompasses groups of the same formula, but where one of R, R' and R" is —C(=O) $C_1$-$C_6$ alkyl.

In preferred embodiments, when the ligand comprises a carboxylate, the ligand may comprise the carboxylate anion of a $C_4$-$C_{20}$, branched or unbranched, monounsaturated or polyunsaturated aliphatic carboxylic acid (such as 3-butenoic acid, 4-hexenoic acid, 5-hexenoic acid, 6-octenoic acid, 7-octenoic acid, 8-decenoic acid, 9-decenoic acid, 10-undecenoic acid, 10-dodecenoic acid, 11-dodecenoic acid, 12-tetradecenoic acid, 13-tetradecenoic acid, 12-hexadecenoic acid, 15-hexadecenoic acid, oleic acid, linoleic acid, linolenic acid, elaidic acid, behenic acid, eleostearic acid and/or arachidonic acid). Similarly, when the ligand comprises an alcoholate, the ligand may comprise a $C_4$-$C_{20}$, branched or unbranched, monounsaturated or polyunsaturated aliphatic alkoxy group (such as 3-butenoxy, 4-hexenoxy, 5-hexenoxy, 6-octenoxy, 7-octenoxy, 8-decenoxy, 9-decenoxy, 10-undecenoxy, 10-dodecenoxy, 11-dodecenoxy, 12-tetradecenoxy, 13-tetradecenoxy, 12-hexadecenoxy, 15-hexadecenoxy, oleyloxy, linoleyloxy, linolenyloxy, elaidyloxy, behenyloxy, eleostearyloxy and/or arachidonyloxy). Also similarly, a preferred thiolate ligand may comprise a $C_4$-$C_{20}$, branched or unbranched, monounsaturated or polyunsaturated aliphatic thio group (such as 2-butenethio, 3-butenethio, 3-hexenethio, 4-hexenethio, 5-hexenethio, 4-octenethio, 6-octenethio, 7-octenethio, 8-decenethio, 9-decenethio, 10-undecenethio, 10-dodecenethio, 11-dodecenethio, 12-tetradecenethio, 13-tetradecenethio, 14-hexadecenethio or 15-hexadecenethio).

In another embodiment, the ligand in the present material may contain a photoreactive group, such as a carbonate or a carbamate, that materially changes the solubility of the material in a developer after photoreaction-inducing irradiation. In organic chemistry, carbonates are considered to be protecting groups for alcohols and/or phenols, and carbamates are considered to be protecting groups for amines (see, e.g., T. Greene et al., "Protective Groups in Organic Synthesis," John Wiley & Sons, New York (1991), the relevant portions of which are incorporated herein by reference). Examples of such groups include t-butoxycarbonyl (t-BOC), nitroveratryloxycarbonyl (NVOC), 4-methoxyphenacyl (Phenoc), benzyloxycarbonyl (Cbz), p-nitrobenzyloxycarbonyl, and others.

In another embodiment, the nanoparticles comprise alkyl-terminated silicon nanoparticles. The alkyl-terminated silicon nanoparticles can be prepared by reacting conventional hydrogen-terminated silicon nanoparticles (e.g., as isolated from an etch step as described in U.S. application Ser. No. 10/339,741, filed Jan. 9, 2003 and entitled "Nanoparticles and Method for Making the Same;" with an alkene (conventionally known as a "hydrosilylation reaction"). More specifically, alkenes suitable for use in the present hydrosilylation reaction include $C_4$-$C_{20}$ branched or unbranched alkenes, such as 1-hexene, 4-methylpentene, 3,3-dimethylbutene, 1-octene, 1-decene, 1-dodecene, 1-tetradecene, 1-hexadecene, 1-octadecene, 1-eicosene, and combinations thereof.

Figure 1A:
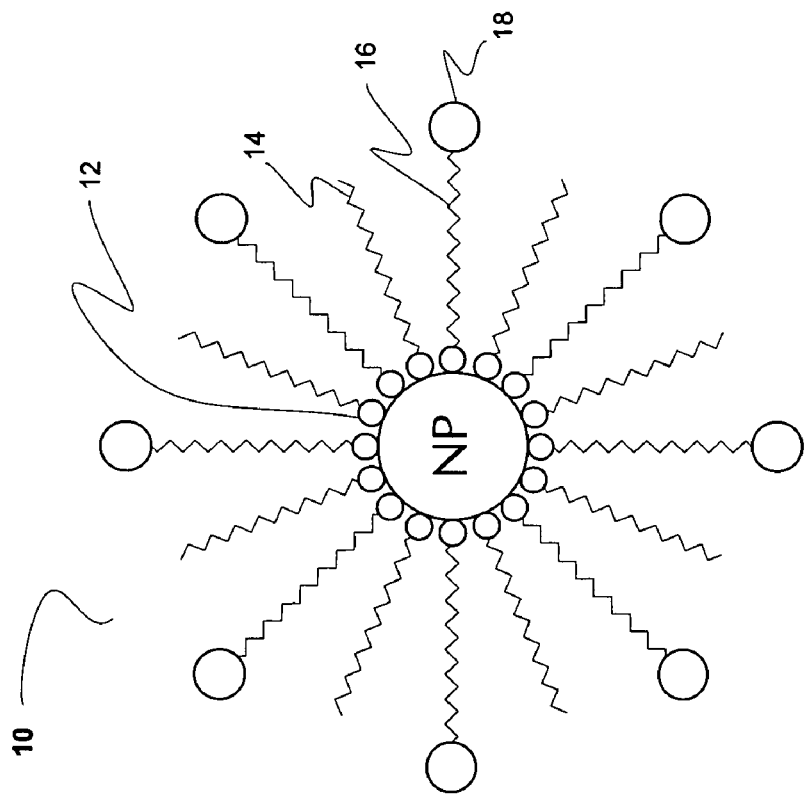

Long-chain alkyl-terminated silicon nanoparticles (e.g., where the ligand comprises a $C_8$-$C_{20}$ largely unbranched alkyl group, preferably a $C_{12}$-$C_{20}$ unbranched alkyl group) are suitable for ligation with a (photo)reactive group having a long-chain alkyl group covalently bound thereto, as shown in FIG. 1B. This "micelle" embodiment 20 typically comprises a nanoparticle core NP of an electronically functional substance, having long-chain alkyl groups 22 covalently bound thereto at least in part as passivation. Ligands 24 have a long-chain alkyl group 26 bound to passivation alkyl groups 22 by van der Waals bonds. (Photo)reactive group 28, which is covalently bound to long-chain alkyl group 26 of ligand 24, is exposed on the outer surface of micelle 20 for (photo)reaction. When such a radiation patternable functional material is formulated for use, a relatively polar solvent (e.g., one having a gas-phase dipole moment of about 1.5 debyes or more, preferably about 2 debyes or more, or which otherwise possesses some ability to solvate ions or polar organic groups) may be used. Examples of such solvents include tetrahydrofuran, dioxane, dichloromethane, nitromethane, acetone, acetonitrile, dimethyl formamide, dimethyl sulfoxide, pyridine, water, or mixtures thereof with relatively less polar solvents such as diethyl ether and toluene but which retain a certain minimum polarity.

However, silicon nanoparticles with remote olefinic groups as the (photo)reactive group are also a preferred exemplary material. Polyunsaturated alkenes, such as α,ω)-alkadienes (e.g., 1,5-hexadiene, 1,7-octadiene, 1,11-dodecadiene, 1,13-tetradecadiene, 1,17-octadecadiene, etc.), may undergo hydrosilylation at only one carbon-carbon double bond when the silicon nanoparticles are sufficiently dilute in the hydrosilylation reaction mixture. Alternatively, one may use an α,ω-alkadiene having a carbon-carbon double bond equivalent or "latent" double bond, such as an epoxide, a halogen, or other stable leaving group such as a trifluoromethylsulfonate or toluenesulfonate (e.g., 6-chlorohexene, 7-trifluoromethylsulfonyl-octene, 12-bromododecene, 13,14-oxotetradecene, squalene 2,3-oxide, limonene oxide (available from Atofina Chemicals, Philadelphia, Pa.), myrcene oxide, terpinene oxide, etc.) in the hydrosilylation reaction to yield a silicon nanoparticle with a (photo)reactive group-containing ligand directly, or one may subsequently remove the "double bond protecting group" (e.g., in an elimination reaction) to provide an alkenyl ligand with a remote site of unsaturation.

Further examples of ligands having (photo)reactive groups suitable for use in the present radiation patternable functional material will be described in greater detail below with respect to the present compounds. Suitable (photo) reactive groups and sources of photoreactive species will be described in greater detail below with respect to the present compositions.

Exemplary Compounds

The present invention also concerns a compound of the formula (1):

$$(R^1-X^1)_m NP(X^2-R^2-Y)_n,$$ (1)

where NP comprises a nanoparticle of an electronically functional substance; Y is a group that is photoreactive or that is reactive with a photochemically generated species and which, after first-order photoreaction or reacting with the photochemically generated species, materially changes the solubility characteristics of the compound in a developer; $X^1$ and $X^2$ are independently a nanoparticle-binding group; $R^1$ is a monovalent group that is not reactive with the photochemically generated species; $R^2$ is a divalent bridging group; m is at least 0, and the m instances of $R^1-X^1$ may be the same or different; and n is at least 1, and the n instances of $X^2-R^2-Y$ may be the same or different. In general, the electronically functional substance is the same as for the exemplary material(s) described above. In preferred implementations, the electronically functional substance consists essentially of nickel, copper, silver, gold, silicon and/or silicon-germanium (the latter two of which may be n-doped or p-doped).

In other embodiments, the electronically functional substance comprises an insulator, which may have other electromagnetically functional properties, such as a magnetic moment, high-temperature superconductivity, phosphorescence or luminescence, etc. For example, the electronically functional substance may comprise an oxide, nitride, oxynitride, carbide, sulfide and/or phosphide of silicon, germanium, tin, aluminum, gallium, indium, titanium, zirconium, vanadium, tantalum, chromium, molybdenum, tungsten, manganese, iron, ruthenium, cobalt, rhodium, nickel, palladium, platinum, copper, silver and/or zinc, such as silicon dioxide, silicon nitride, silicon oxynitride, silicon carbide, aluminum oxide, titanium oxide, zinc oxide, zinc sulfide, indium tin oxide, etc.

$X^1$ and $X^2$ are independently a nanoparticle-binding group, similar to the nanoparticle-binding member of the exemplary material(s) described above. For example, $X^1$ and $X^2$ may be independently a chalcogen (e.g., O or S atom), a carboxylate group, a thiocarboxylate group, an alkylene group (e.g., a group of the formula $C_nH_{2n}$, where n is from 1 to 20, preferably from 2 to 6), $NR^5$ (where $R^5$ is H or a $C_1$-$C_6$ alkyl group), $S(O)_x$ (where x is from 1 to 3), or $P(O)_y(R^6)_z$ (where y is from 1 to 3, z is 1 or 2, and each $R^6$ is independently H, phenyl or a $C_1$-$C_6$ alkyl group). Preferably, $X^1$ and $X^2$ are independently at least one nanoparticle-binding member selected from O, S, a carboxylate, and a —$CH_2CH_2$— group.

$R^1$ is generally any monovalent group that is not photoreactive or reactive with the photochemically generated species selected to form a thin film. In the compound of formula (1), m may be 0, but in most cases m will be greater than 0. Although a precise ratio of m (non[photo]reactive group-containing ligands) to n ([photo]reactive group-containing ligands) is not required, for convenience and processing cost, the m:n ratio may be anywhere from 19:1 to 1:9, preferably 9:1 to 1:2, and more preferably 4:1 to 1:1. While the m instances of $R^1-X^1$ may be the same or different, they are preferably substantially the same.

Examples of suitable $R^1$ groups include alkyl, cycloalkyl, aryl or aralkyl, each of which may be substituted one or more times with a halogen or with a substituent selected from the group consisting of alkyl (except for $R^1$=alkyl), cycloalkyl, aryl, aralkyl (except for $R^1$=alkyl), alkoxy, alkylthio, alkylcarbonyl, alkoxycarbonyl, alkylcarboxy, alkylamino, dialkylamino, alkylamido, dialkylamido, cycloalkoxy, cycloalkylthio, cycloalkylcarbonyl, cycloalkoxycarbonyl, cycloalkylcarboxy, cycloalkylamino, di(cycloalkyl)amino, (cycloalkyl)(alkyl)amino, cycloalkylamido, di(cycloalkyl)amido, (cycloalkyl)(alkyl)-amido, aryloxy, arylthio, arylcarbonyl, aryloxycarbonyl, arylcarboxy, arylamino, diarylamino, (aryl)(alkyl)amino, arylamido, aralkoxy, aralkylthio, aralkylcarbonyl, aralkoxycarbonyl, aralkylcarboxy, aralkylamino, diaralkylamino, (aralkyl)(alkyl)amino, heterocyclyl, trialkylsilyl, and trialkylsilyloxy, each of which may be further substituted with one or more halogens, alkyl groups (except for alkyl substituents on $R^1$) and/or alkoxy groups. In preferred embodiments, $R^1$ is $C_4$-$C_{20}$ alkyl which may be substituted one or more times with a halogen, a $C_1$-$C_6$ alkoxy, $C_3$-$C_8$ cycloalkyl, phenyl and/or $C_{10}$-$C_{20}$ aryl, each of which (except for halogen) may be further substituted with one or more halogens, $C_1$-$C_6$ alkyl groups and/or $C_1$-$C_6$ alkoxy groups.

$R^2$ is generally any divalent bridging group that can covalently bind to both nanoparticle-binding group $X^2$ and (photo)reactive group Y. $R^2$ may or may not be (photo)reactive, but preferably, it is not (photo)reactive. In the compound of formula (1), n is at least 1, preferably at least 2, and more preferably at least 4. While the n instances of $X^2$—$R^2$—Y may be the same or different, they are preferably substantially the same.

Examples of suitable $R^2$ groups include alkylene, alkyleneoxy, alkyleneoxyalkylene, alkyleneoxyalkyleneoxy, alkylenethio, alkylenethioalkylene, alkylenecarbonyl, alkyleneoxycarbonyl, alkylenecarboxy, alkyleneamino, alkylene(alkyl)amino, alkylene(alkyl)aminoalkylene, alkyleneamido, alkylene(alkyl)amido, cycloalkylene, cycloalkyleneoxy, cycloalkylene-thio, cycloalkylenecarbonyl, cycloalkyleneoxycarbonyl, cycloalkylenecarboxy, cycloalkylene-amino, (cycloalkylene)(alkyl)amino, cycloalkyleneamido, (cycloalkylene)(alkyl)amido, arylene, alkylene-arylene, alkylene-arylene-alkylene, aryleneoxy, alkyleneoxyarylene, alkylene-aryleneoxy, aryleneoxyalkylene, arylenethio, alkylene-arylenethio, arylenethioalkylene, arylenecarbonyl, alkylene-arylenecarbonyl, aryleneoxycarbonyl, alkylene-aryleneoxycarbonyl, arylenecarboxy, alkylene-arylenecarboxy, aryleneamino, alkylene-aryleneamino, arylene(aryl)-amino, alkylene-arylene(aryl)amino, arylene(alkyl)amino, alkylene-arylene(alkyl)amino, alkylene(aryl)amino, aryleneamido, aralkylene, aralkyleneoxy, (alkylene)aralkyleneoxy, aralkylenethio, aralkylenecarbonyl, aralkyleneoxycarbonyl, aralkylenecarboxy, aralkyleneamino, aralkylene(aryl)amino, (aralkylene)(alkyl)amino, (alkylene)(aralkyl)amino, heterocyclylene, alkylene-heterocyclylene, and alkylene-heterocyclylene-alkylene, each of which may be further substituted with one or more halogens, alkyl groups (except where $R^2$=alkylene), alkoxy groups, trialkylsilyl, and/or trialkylsilyloxy groups. In preferred embodiments, $R^2$ is alkylene, alkylene substituted with one or more halogens and/or alkoxy groups, alkyleneoxy, alkyleneoxyalkylene, alkyleneoxyalkyleneoxy, alkylene(alkyl)amino, cycloalkylene, arylene, arylene substituted with one or more halogens, alkyl groups and/or alkoxy groups, aryleneoxy, arylenethio, aralkylene, alkylene-arylene, and (alkylene)aralkylene, more preferably $C_4$-$C_{20}$, branched or unbranched, saturated or unsaturated alkylene; $C_7$-$C_{20}$, branched or unbranched, substituted or unsubstituted aralkylene groups; $C_8$-$C_{20}$, branched or unbranched, substituted or unsubstituted alkylene-aralkylene groups; $C_4$-$C_{20}$, branched or unbranched, saturated or unsaturated alkyleneoxy or alkyleneoxyalkylene groups; and $C_4$-$C_{20}$, branched or unbranched, saturated or unsaturated alkylenethio or alkylenethioalkylene groups.

In the exemplary compound(s), Y is itself photoreactive, or is reactive with a photochemically generated species and which, after reacting with the photochemically generated species, materially changes the solubility characteristics of the material in the developer. Sources for the photochemically generated species (which may help to define the photochemically generated species, and in turn, suitable reactive Y groups) will be described in greater detail below with respect to the present photodefinable or photopatternable compositions. When Y itself is photoreactive, Y may be a carbonate and/or a carbamate as described above. However, in preferred embodiments, Y is reactive with a photochemically generated species, and may comprise a carbon-carbon double bond, an epoxide, an oxirane, an aziridine, and/or a phenol.

When Y comprises a carbon-carbon double bond, Y may be a vinyl group, a vinylidene group (such as an allyl group), or a vinylidene group substituted with a halogen, a $C_1$-$C_6$ alkoxy group, a phenyl group, a phenyl group substituted with one or more halogens, $C_1$-$C_6$ alkyl groups, $C_1$-$C_6$ alkoxy groups and/or di-($C_1$-$C_6$ alkyl)amino groups, a —C(=O)—$C_1$-$C_6$ alkyl group, a —C(=O)—$C_1$-$C_6$ alkoxy group, or a cyano group. When Y comprises an epoxide, Y may have the formula (2):

where R, R' and R" are independently H, $C_1$-$C_6$ alkyl or $C_2$-$C_6$ alkenyl (preferably H or $C_1$-$C_4$ alkyl); more preferably, at least two of R, R' and R" are H, and the remaining one is H or $CH_3$.

When Y comprises a phenol, Y may have the formula —Ar—O—PG, where Ar is phenylene (—$C_6H_4$—) or $C_{10}$-$C_{20}$ aryl, each of which may be further substituted with one or more of the following groups: halogen, nitro, $C_1$-$C_6$ alkyl, $C_1$-$C_6$ alkoxy, $C_1$-$C_6$ alkylthio, $C_2$-$C_6$ alkylcarbonyl, $C_1$-$C_6$ alkoxycarbonyl, di-$C_1$-$C_6$-alkylamino, $C_1$-$C_6$ alkylamido, aryloxy, arylthio, heterocyclyl, trialkylsilyl, and/or trialkylsilyloxy; and PG is a conventional phenolic protecting group that may be cleaved by reaction with the photochemically generated species (see, e.g., T. Greene et al., "Protective Groups in Organic Synthesis," $2^{nd}$ ed., John Wiley & Sons, New York (1991), the relevant portions of which are incorporated herein by reference). Examples of suitable phenolic protecting groups include those that can be cleaved with a photogenerated acid, such as methoxyalkyl ethers, methoxyalkoxy ethers, esters of aliphatic carboxylic acids and aliphatic carbonates, and those that can be cleaved with photogenerated fluoride, such as trialkylsilyl ethers (which in some cases can also be cleaved with photogenerated acid). It is noted that when PG is an o-nitrobenzyl ether or 9-fluorenecarboxylic acid ester, it can be cleaved by photolysis, thereby rendering it a photoreactive group.

Exemplary Methods of Making the Material(s) and/or Compound(s)

The present invention further relates to methods of making the exemplary material(s) and/or compound(s) described above. The methods of radiation patternable nanoparticle synthesis generally fall into one or more of four types: (i) ligand exchange; (ii) ligand addition (or micelle formation);

(iii) ligand modification (e.g., functional group coupling and/or substitution onto the ligand); and (iv) functional group addition (e.g., addition of a functional group or functional group component to the ligand). Thus, the invention relates to a number of exemplary methods of making the above-described exemplary material(s) and/or compound(s).

In a first embodiment, the method generally is a "ligand exchange" type of synthesis, and comprises the steps of reacting the nanoparticles (which may or may not have ligands or passivation thereon) with one or more non-ligated compounds corresponding to the ligands having the photoreactive group or the group that is reactive with the photochemically generated species; and isolating and/or purifying the material and/or nanoparticle-based compound. The non-ligated compounds may, for example, be protonated (photo) reactive ligands suitable for the exemplary materials described above, and/or may have the formula H—$X^2$—$R^2$—Y, where $X^2$, $R^2$ and Y have the definitions provided above. In either case, the "ligand exchange" reacting step may comprise mixing (1) nanoparticles of an electronically functional substance containing ligands (or passivation) not having a (photo)reactive group bound thereto and (2) the (protonated) non-ligated compounds having the (photo)reactive group bound thereto in a solvent for a length of time sufficient to exchange at least a portion of the non-ligated compounds for the ligands not having a (photo)reactive group.

In certain preferred implementations, one may simply drive the ligand exchange reaction equilibrium towards formation of the nanoparticle-(photo)reactive group-containing ligand complex by employing a molar excess of protonated (photo)reactive group-containing ligand with respect to the starting nanoparticles having ligands (or passivation) without (photo)reactive groups or with respect to the ligands on such starting nanoparticles, for example according to the following equation:

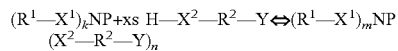

In such an embodiment, the molar amount of protonated (photo)reactive group-containing ligand (or compound of the formula H—$X^2$—$R^2$—Y, or a salt thereof) is usually at least 4 or 5 times the molar amount of nanoparticles, preferably at least 1.1 times the molar amount of ligands (or passivation) without (photo)reactive groups (e.g., $R^1$—$X^1$ in $(R^1—X^1)_k$NP), and more preferably at least 2 times the molar amount of ligands without (photo)reactive groups in the starting material. Furthermore, m and n need not necessarily equal k, and in most cases, m+n≠k.

In other preferred implementations, one may further mix a catalytic, equivalent or excess amount by moles (with respect to the non-ligated compound) of a conventional Lewis base (such as a trialkylamine, pyridine, or carbonate or bicarbonate salt) in the reaction mixture to promote the ligand exchange. The temperature for the "ligand exchange" synthesis method may be from 0° C., more preferably at or about room temperature, to the boiling point of the solvent used for the reaction (preferably <150° C., more preferably <100° C.). This embodiment is particularly preferred where $R^1$—$X^1$ is $R^1$—C(=O)—O— and H—$X^2$—$R^2$—Y is H—S—$R^2$—Y. In one implementation, the solvent can comprise or consist essentially of pyridine, and the reaction is performed at the boiling point of the solvent. Optionally, one can add a stronger base (such as triethylamine) or a base that yields an "autoremovable" byproduct (such as potassium or tetraethylammonium carbonate, which yields carbon dioxide gas) to the reaction mixture, at the beginning, during or towards the end of the reaction to help inhibit the reverse reaction in the equilibrium equation above.

Suitable solvents generally include aprotic solvents such as alkanes (e.g., $C_6$-$C_{20}$ alkanes), alkenes (e.g., $C_6$-$C_{20}$ alkenes), cycloalkanes (e.g., cyclohexane), halogenated alkanes (e.g., $C_1$-$C_6$ alkanes having from 2 to 2n+2 fluorine, chlorine and/or bromine atoms, where n is the number of carbon atoms), halogenated alkenes (e.g., $C_2$-$C_6$ alkenes having from 2 to 2n fluorine, chlorine and/or bromine atoms, where n is the number of carbon atoms), arenes (e.g., benzene), substituted arenes (e.g., benzene substituted with from 1 to 3 halogen, $C_1$-$C_4$ alkyl, and/or $C_1$-$C_4$ alkoxy groups), ethers (e.g., $C_4$-$C_{20}$ ethers), cyclic ethers (e.g., tetrahydrofuran, dioxane), aliphatic ketones (e.g., $C_3$-$C_{10}$ ketones), aliphatic esters (e.g., $C_1$-$C_6$ aliphatic esters of $C_2$-$C_{12}$ aliphatic carboxylic acids), aliphatic amides (e.g., di-$C_1$-$C_4$ aliphatic amides of $C_1$-$C_4$ aliphatic carboxylic acids), aliphatic sulfoxides (e.g., dimethylsulfoxide), and mixtures thereof. Preferably, the solvent or solvent mixture is relatively nonpolar, which may help inhibit the reversibility of the exchange reaction after it occurs. Also, the solvent(s) preferably have a boiling point at 1 atm. pressure of less than 200° C., more preferably ≦150° C. The material and/or compound having the (photo)active ligand bound thereto may be isolated by filtering the reaction mixture (e.g., to remove salt byproducts), then removing the solvent (e.g., under vacuum). The material and/or compound may be further purified by dissolving it in a suitable solvent and precipitating the material and/or compound out of solution (e.g., by rapidly adding a relatively large amount of a solvent in which the material and/or compound has a low solubility).

In a second embodiment of the method of making the exemplary material(s) and/or compound(s) above, the method comprises mixing (i) the nanoparticles having bound thereto ligands not containing a (photo)reactive group with (ii) one or more non-ligated compounds corresponding to the ligands containing the (photo)reactive group, the non-ligated compounds forming a van der Waals complex, or micelle, with the ligands not containing a (photo)reactive group; and isolating and/or purifying the material. In this embodiment, the method may be as simple as mixing for a period of time sufficiently long to form the micelle, removing the solvent, and (optionally) purifying by precipitation. Solvents suitable for this embodiment include those described above for the first exemplary synthesis method.

This "micelle" or "ligand addition" method is effective for synthesizing nanoparticles having a ligand (in this case, a ligand comprising two or more molecularly separate species bound to each other by van der Waals forces) with a (photo)reactive group as an integral part of the material. It is also envisioned that the micelle-forming mixture may be used in situ in the exemplary composition(s) and/or thin film-forming method(s) described below.

In a third embodiment, the method of making the exemplary material(s) and/or compound(s) above comprises either:

(a-1) mixing nanoparticles of the formula $(R^1—X^1)_m$NP $(X^2—R^3—Z)_n$, where $R^3$ is any $R^2$ group, Z is a leaving group or electrophile, and NP, m, n, $X^1$, $X^2$, $R^1$ and $R^2$ are as defined above, with a compound of the formula H—Y, H—Nu—Y, H—Nu—$R^4$—Y or a salt of such compounds, where Nu is a conventional nucleophile and $R^4$ is $R^2$ minus $R^3$, and Y is as defined above, in a reaction mixture, or (a-2) mixing nanoparticles of the formula $(R^1—X^1)_m$NP $(X^2—R—Nu—H)_n$ or a salt thereof with a compound of the formula Z—Y or Z—R$^4$—Y in a reaction mixture, where R$^1$, R$^3$, R$^4$, NP, m, n, X$^1$, X$^2$, Nu, Y and Z are as defined above; and (b) isolating and/or purifying the exemplary material and/or the compound of the formula (1) from the reaction mixture.

This third embodiment is representative of the "ligand modification" type of photodefinable functional material synthesis, and is largely based on nucleophilic and/or electrophilic substitution reactions. The nucleophile and electrophile may be part of either the ligand reactant or the reactant providing the (photo)reactive group, as long as one of the nucleophile and electrophile is part of one reactant and the other of the nucleophile and electrophile is part of the other reactant. Suitable nucleophiles, electrophiles and reaction conditions are generally conventional (see, e.g., J. March, "Advanced Organic Chemistry," 3$^{rd}$ ed., John Wiley & Sons, New York (1985), pp. 255-607 and references cited therein; however, the relevant portions of the entire text are incorporated herein by reference).

In one implementation, the starting nanoparticles have the formula (R$^1$—X$^1$)$_m$NP(X$^2$—R$^3$—OH)$_n$, (R$^1$—X$^1$)$_m$NP(X$^2$—R$^3$—COOR$^5$)$_n$ or (R$^1$—X$^1$)$_m$NP(X$^2$—R$^3$—SH)$_n$, where X$^2$ is independently a carboxylate (—O—(O═)C—), oxygen atom (—O—) or sulfur atom, and R$^5$ is H or an ester protecting group. In the case where X$^2$ is O, polyols, such as α,ω-diols (e.g., 1,5-hexanediol, 1,7-octanediol, 1,11-dodecanediol, 1,13-tetradecanediol, 1,17-octadecanediol, etc.), may bind to the nanoparticle at only one oxygen atom when the nanoparticles are sufficiently dilute in the diol ligation reaction mixture. Alternatively, one may use an α,ω-diol having one alcohol group protected, such as an ester, a trialkylsilyl ether, or other stable protecting group (see, e.g., T. Greene et al., "Protective Groups in Organic Synthesis," John Wiley & Sons, New York (1991), pp. 10-117, the relevant portions of which are incorporated herein by reference). The same principles generally apply to α,ω-dithiols and α,ω-dicarboxylic acids.

However, where X$^2$ is not the same as the group at the other terminus of the ligand, one may selectively bind one functional group to the nanoparticle and leave the other as the Z or NuH group above. For example, when the nanoparticles consist essentially of a metal (e.g., Ag or Cu), X$^2$ can be a carboxylate and NuH can be OH, or X$^2$ can be S and NuH can be OH or a carboxylic acid. In either case, NuH can be an amine or a phosphine. Further, when the nanoparticles consist essentially of silicon or a silicon-germanium mixture, X$^2$ can be O and NuH can be COOH or SH. Examples of suitable ligand precursors include 5-hydroxyhexanoic acid, mevalonic acid, 8-hydroxyoctanethiol, 12-mercaptododecanoic acid, 13-hydroxytetradecanoic acid, etc. that may yield a nanoparticle with an appropriate reactive group-containing ligand directly.

Furthermore, nanoparticles of the formula (R$^1$—X$^1$)$_m$NP(X$^2$—R$^3$—Z)$_n$ may be reacted with a compound of the formula H—Nu—Y, H—Nu—R$^4$—Y or a salt of such compounds, where Z is a leaving group, such as chlorine, bromine, iodine, toluenesulfonate, acetate, etc., and Nu is a divalent nucleophile such as an alkylamine, an alkoxide salt, a sulfide anion, metal alkynyl salts, an α-keto anion (such as of an α-ester, α,γ-diketone, α,γ-diester or α,γ-ketoester), etc., in accordance with known techniques (see, e.g., J. March, supra). To make starting nanoparticles of the formula (R$^1$—X$^1$)$_m$NP(X$^2$—R$^3$—Z)$_n$, one can conduct a ligand exchange reaction using a difunctional reactant such as 6-bromohexanol, 8-hydroxyoctanoic acid, 11-bromododecanethiol, etc., or react such a nanoparticle where Z═OH with a conventional acylating agent or sulfonylating agent, in accordance with known techniques. Examples of compounds of the formula H—Nu—Y and/or H—Nu—R$^4$—Y suitable for this implementation of the present synthesis method include α,ω-thiocarboxylic acids and α,ω-aminocarboxylic acids (or esters thereof) such as 6-aminocaproic acid and cysteine, α,γ-diesters such as diethyl malonate, α,γ-ketoesters such as methyl acetoacetate, or stabilized allyl anions such as alkali metal salts of methyl crotonate or crotononitrile. Where a carboxylic acid functional group has been protected as a corresponding ester, one may either cleave the protecting group in accordance with known techniques to provide a carboxylic acid, or keep the ester intact if it is a (photo)reactive ester (e.g., one that may be cleaved by reaction with photochemically generated acid.)

Similarly, nanoparticles of the formula (R$^1$—X$^1$)$_m$NP(X$^2$—R$^3$—Z)$_n$ may be reacted with a compound of the formula H—Y or a salt thereof. In such an embodiment, Y is, e.g., a cyamide, azide, hydroxide or sulfide anion, such as KCN, NaN$_3$, tetraethylammonium hydroxide or Na$_2$S. When Y is CN, it may be converted into a (photo)reactive group by conventional cyamide hydrolysis. When Y is OH, it may be converted into a (photo)reactive group by conventional carbonate or carbamate formation. When Y is SH, it may be converted into a (photo)reactive group by conventional oxidation to a sulfonic acid or by conventional thiocarbonate or thiocarbamate formation. When Y is azide, it may itself be a (photo)reactive group, or it may be converted into an amine, amide or carbamate by known methods.

Alternatively, nanoparticles of the formula (R$^1$—X$^1$)$_m$NP(X$^2$—R$^3$—Nu—H)$_n$ or a salt thereof may be reacted with a compound of the formula Z—Y or Z—R$^4$—Y in a reaction mixture. In this case, preferred nucleophiles include chalcogenide atoms (e.g., O or S), phenolate anions (e.g., —C$_6$H$_4$—O$^-$), amines (e.g., —NR$^5$—, where R$^5$ is as defined above), carboxylates and aryl groups (e.g., phenylene groups that may be substituted with 1 or 2 electron-donating groups such as alkyl, alkoxy and/or dialkylamino groups). Compounds of the formula Z—Y and/or Z—R$^4$—Y include those in which Z, R$^4$ and Y are as described above. Examples include (t-BOC)$_2$O, (substituted) allyl halides (which result in R$^4$ being a —CHR— group and Y being a carbon-carbon double bond), acyl chlorides or anhydrides of aliphatic carboxylic acids (preferably (meth)acryloyl chloride), etc. When Nu is (substituted) phenylene, a conventional and/or appropriate Lewis acid may be added to the reaction mixture (as long as it does not adversely affect the properties of the nanoparticle core). The reactions are generally conducted in accordance with known techniques for such reactions. Product isolation and purification may be conducted as described above.

In a fourth embodiment, the method comprises the steps of reacting nanoparticles of the formula (R$^1$—X$^1$)$_m$NP(X$^1$—R$^3$—(CR═CR'R''))$_k$, where k is an integer greater than 1 (preferably, k is equal to n, where n is as described above) and where NP, R$^1$, X$^1$, R, R' and R'' are as defined above and R$^3$ is R$^2$ or a precursor thereof, with an epoxidizing agent or source of Y$^+$, Y$^-$ or Y.; and isolating and/or purifying the material or compound from the reaction mixture. The term "precursor of R$^2$" refers to a case where R$^3$, after reaction with a ligand modification or ligand addition agent (in this case, an epoxidizing agent or source of Y$^+$, Y$^-$ or Y.), results in formation of an appropriate R$^2$ group. Preferably, in this fourth embodiment, CR═CR'R'' is CH═CH$_2$. This fourth embodiment is representative of the "ligand addition" type of synthesis.

The starting nanoparticles may be made as described above. The epoxidizing agent is conventional, and examples include peroxybenzoic acid (PhC(=O)OOH), peroxyacetic acid (PhC(=O)OOH), derivatives of such peroxy acids, alkaline $H_2O_2$, and alkyl peroxides such as t-butyl peroxide (which may further employ an appropriate transition metal catalyst). Reaction conditions are also conventional (see, e.g., J. March, "Advanced Organic Chemistry," 3$^{rd}$ ed., John Wiley & Sons, New York (1985), pp. 735-737 and references cited therein, the relevant portions of which are incorporated herein by reference). Epoxidation conditions are also conventional, and the reaction product may be isolated and purified as described above.

Nanoparticles of the formula $(R^1-X^1)_m NP(X^1-R^3-(CH=CH_2))_k$, may also be reacted with a source of $Y^+$, $Y^-$ or $Y^\cdot$, where Y is as described above. "Y+" indicates an electrophilic addition of Y (e.g., from Z—Y) to the C=C double bond where $Y^+$ is the electrophile, and "Y$^-$" indicates an electrophilic addition of HY to the C=C double bond where H+ is the electrophile. "Y$^\cdot$" indicates a radical addition of Y (e.g., from HY or $Y_2$) to the C=C double bond. Sources of $Y^+$ include HOCl, HOBr, $IN_3$ and INCO. Sources of $Y^-$ include HCl, HBr, and aliphatic acids such as acetic acid. Sources of Y. include HCl, HBr, $Br_2$ and $H_2O_2$. Reaction reagents and conditions are conventional (see, e.g., March, supra). For example, each of these reactions may be performed in the presence of an appropriate catalyst where necessary and/or desired. Product isolation and purification may be conducted as described above.

Exemplary Thin Film-Forming Compositions

In another aspect, the present invention concerns a radiation definable composition for making an electronically functional thin film. The radiation definable functional film composition generally comprises the exemplary material(s) and/or compound(s) described above, and a solvent in which the material(s) and/or compound(s) is/are soluble. In such an embodiment, the nanoparticle material(s) and/or compound(s) may be present in the ink in a percentage by weight of from 0.1% to 50%, more preferably from 0.5 to 30 wt. %, and even more preferably from 1.0 to 20 wt. %. Preferably, where the nanoparticle material(s) and/or compound(s) does not contain a photoreactive group, the composition further comprises a source of the photochemically generated species that materially changes the solubility of the nanoparticle material(s) and/or compound(s) in a developer after irradiation of the composition.

The preferred sources of photochemically generated species may be selected from five (5) general types: azides, photogenerated acid sources, photogenerated radical sources, carbonates, and quinones. Each of these photochemically generated species source types generates a different reactive species upon irradiation with a photochemically activating wavelength of ultraviolet light. As a result, preferred (photo)reactive groups for the nanoparticle ligands tend to correlate to the type of photochemically generated species source.

For example, when the source of the photochemically generated species is an azide, the group that is reactive with the photochemically generated species may comprise a carbon-carbon double bond. Preferably, the carbon-carbon double bond comprises a group of the formula CR=CR'R", where R, R' and R" are independently H, $C_1$-$C_6$ alkyl, $C_2$-$C_6$ alkenyl or phenyl (which may be substituted with from 1 to 5 substituents independently selected from halogen, hydroxyl, $C_1$-$C_6$ alkyl, $C_1$-$C_6$ alkoxy and di-($C_1$-$C_6$ alkyl) amino). More preferably, at least 2 of R, R' and R" are H and the remaining one is H or $CH_3$.

When the source of the photochemically generated species is an azide, the azide is preferably a conventional diazide, including alkylene diazides such as 1,5-diazidopentane, 1,7-diazidoheptane, 1,11-diazidoundecane, and 1,12-diazidododecane; alkylene sulfonazides such as 1,7-heptane-bis(sulfonazide), 1,11-undecane-bis(sulfonazide), 1,12-dodecane-bis(sulfonazide), and 1,9,18-octadecane-tris (sulfonazide); aromatic sulfonazides such as 1,3-benzene-bis(sulfonazide), 1-octyl-2,4,6-benzene-tris(sulfonazide), 4,4,-diphenylmethane-bis(sulfonazide) and 4,4'-diphenyldisulfido-bis(sulfonazide); azide formates, such as n-octadecylazide formate, tetramethylene-bis(azide formate), phenylazide formate, 2,2'-isopropylidene-bis(P,P'-phenylazide formate), 2,2'-oxydiethyl-bis(azide formate), 2,2'-ethylene-dioxydiethyl-bis(azide formate) and 2,2'-thiodiethyl-bis (azide formate); and aromatic polyazides, such as m-phenylene diazide, 2,4,6-triazidobenzene 4,4'-diazidophenylamine, 4,4,-diphenylmethane diazide, and 2,6-bis(4-azidobenzylidene)-4-methylcyclohexanone.

While not wishing to be bound to any particular theory, upon irradiation with an appropriate wavelength and intensity of ultraviolet light (e.g., 1-line irradiation from a mercury arc lamp, at 365 nm), azide groups photolyze into molecular nitrogen and a nitrene, which reacts with an olefinic double bond to form an aziridine ring. When a diazide reacts with olefinic double bonds on ligands bound to two different nanoparticles, those nanoparticles become linked (or cross-linked) to each other. As the diazides react with different double bonds on ligands bound to different nanoparticles, the nanoparticle-ligand species start to oligomerize and/or polymerize. When the diazides are present in a sufficiently high concentration (either by weight or by moles), the resultant nanoparticle-ligand-diazide oligomers and/or polymers have a sufficiently high molecular weight that the solubility of the oligomers and/or polymers is significantly and/or materially lower in a developer that is subsequently used to remove non-irradiated material. Thus, it is also within the scope of the present composition to include both carbon-carbon double bonds and azide groups on the nanoparticle ligands, either as (photo)reactive groups on different ligands bound to the same nanoparticle core (a "self-reactive" or "auto-polymerizable" nanoparticle-ligand complex) or as (photo)reactive groups on ligands bound to different nanoparticles (a "complementary" composition of nanoparticle-ligand complexes, in which the nanoparticle cores may comprise the same or different electronically functional substance).

In such a photodefinable composition, one may consider the possibility of other species in the composition (such as the nanoparticle cores) absorbing light at a wavelength near that at which the photochemically generated species source (in this example, an azide) absorbs, in which case one may wish to select or design a photochemically generated species source that selectively absorbs a relatively greater proportion of light at a different wavelength away from that at which the other species absorbs, and preferably at which the other species shows relatively poor absorption. For example, nanoparticles of certain metals, such as silver, that have an average core particle size of from 3 to 10 nm tend to absorb UV light at 365 nm (the I-line of a mercury arc lamp), as do most azides. While this common absorption is not particularly adverse to the cross-linking reaction, it would be desirable to "blue-shift" the absorption of the azide towards a wavelength such as 313 nm, where the Ag nanoparticles absorb relatively poorly (i.e., there is a noticeable trough in the UV absorption spectrum at 313 nm) and where mercury arc lamps have a particularly strong irradiance. Principles of structural and synthetic organic chemistry for "blue-shifting" the UV absorbance of a photochemically generated species source are well known, and the general principle described in this paragraph is equally applicable to other nanoparticle core substances and other sources of UV irradiation.

Further, when the source of the photochemically generated species is a photogenerated acid source, the group that is reactive with the photochemically generated species may be selected from the group consisting of an epoxide, an oxirane, an aziridine, and an activated carbon-carbon double bond. Photogenerated acid sources, or "photoacid generators" (PAGs), are well-known in the art. Examples include onium salts such as diazonium salts, ammonium salts, phosphonium salts, iodonium salts (e.g., IRGACURE 250, sold by Ciba Specialty Chemicals, Basel, Switzerland), sulfonium salts, selenonium salts and arsonium salts; organic halogen compounds, photoacid generators having o-nitrobenzyl type protective groups, compounds producing sulfonic acids by photolysis such as iminosulfonates (e.g., CGI 1311, CGI 1325, CGI 1380, CGI 1397, CGI 263 and CGI 268, sold by Ciba Specialty Chemicals, Basel, Switzerland), disulfone compounds, diazoketosulfone compounds and diazodisulfone compounds (such as naphthoquinone sulfonylazides). Such compositions may further contain a conventional photosensitizer in a conventional amount by mol. % or wt. %.

The (photo)reactive group may be an epoxide of the formula (2) above, an oxirane of the formula (3):

where each R, R' and R'' is independently H, $C_1$-$C_6$ alkyl or $C_2$-$C_6$ alkenyl (preferably H or $C_1$-$C_4$ alkyl; more preferably, at least three of the R, R' and R'' substituents are H, and the remaining two are H or $CH_3$); an aziridine of the formula (4):

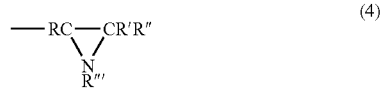

where R, R', R'' and R''' are each independently H, $C_1$-$C_6$ alkyl, $C_2$-$C_6$ alkenyl, $C_2$-$C_6$ aliphatic acyl, $C_7$-$C_{14}$ aromatic acyl, or phenyl (preferably H or $C_1$-$C_4$ alkyl; more preferably, at least two of the R, R' and R'' substituents are H, the remaining one of the R, R' and R'' substituents is H or $CH_3$, and R''' is $C_1$-$C_4$ alkyl, acetyl or benzoyl); or an activated carbon-carbon double bond. In this context, an "activated carbon-carbon double bond" is as described above.

When the source of the photochemically generated species is a photogenerated radical source, the group that is reactive with the photochemically generated species preferably comprises a (meth)acrylate. In this application, a "(meth)acrylate" refers to acrylic acid, α- or β-methacrylic acid, or an ester thereof (e.g., a $C_1$-$C_6$ alkyl, $C_2$-$C_6$ alkenyl, or $C_7$-$C_{14}$ aralkyl, any of which may be substituted with one or more halogens, $C_1$-$C_6$ alkoxy, mono- or di-$C_1$-$C_6$ amino, cyclic amino, $C_2$-$C_6$ alkanecarboxy, or $C_3$-$C_6$ alkenecarboxy groups), preferably a $C_1$-$C_4$ alkyl ester thereof. Of course, other olefinic double bonds are expected to be (photo) reactive with photochemically generated radicals, such as vinyl groups, allyl groups, dienes, styrenyl groups, cinammyl groups, and β,γ-unsaturated ketones and aldehydes, but (meth)acrylates are particularly preferred (photo) reactive groups for radical-based oligomerization and/or polymerization of photodefinable nanoparticle-based compositions.

Photogenerated radical sources are also very well known, and are often identified as photopolymerization initiators or "photoinitiators." While such compounds are too numerous to list herein, preferred examples include those photoinitiators that are easily removed by heating and that do not contain atoms or species that could potentially adversely affect electronic properties of the thin film, such as halogens, Se, alkali or alkaline earth metals, silicates or siloxy groups, boron or aluminum. Suitable examples include most conventional radical initiators, such as 2,2'-azobisisobutyronitrile (AIBN), 1,1'-azobiscyclohexanecarbonnitrile, dibenzoylperoxide, silyl potassium, hexamethyldisilane (the latter being particularly suitable when the nanoparticle core comprises or consists essentially of silicon), t-butyl peroxide, di-t-butyl peroxide, and teriary alcohols such as 2-hydroxyprop-2-yl phenyl ketone, 2-hydroxyprop-2-yl (4-[2'-hydroxyethoxy]phenyl) ketone, 1-hydroxycyclohexyl phenyl ketone (each of which is sold by Ciba Specialty Chemicals, Basel, Switzerland, under the respective tradenames IRGACURE 2959, Darocur 1173 and IRGACURE 184), 2-benzyl-2-dimethylamino-1-(4-morpholinophenyl)-1-butanone (sold by Ciba Specialty Chemicals, Basel, Switzerland, under the tradename IRGACURE 369), and others. The amount of radical initiator added can vary from 0.00001 mol % to 10 mol % (preferably 0.001 mol % to 2.0 mol %) with respect to the number of (photo)reactive groups on the nanoparticle ligands.

As mentioned above, in certain embodiments, the ligands may contain a photochemically reactive group. In such cases, the photochemically reactive group may comprise an azide as described above, a carbonate or a carbamate. Certain carbonates may be cleaved photolytically in accordance with known techniques to yield an alcohol or phenol, and certain carbamates may be cleaved photolytically in accordance with known techniques to yield an amine. "Autophotochemically reactive" nanoparticle-ligand complexes are also advantageous in that there is no need to remove a non-electronically functional source of photochemically reactive groups other than the ligands themselves. As will be discussed in greater detail below, one object the present invention seeks to achieve is to minimize the amount (typically by weight) of non-electronically functional materials, such as ligands, photochemically reactive group sources, binders/additives and/or solvents.

Carbonates of phenols are particularly useful photochemically reactive groups, as phenols generally have significantly and/or materially (if not dramatically) different solubilities in mild base (e.g., aqueous potassium carbonate) than do the corresponding unreacted carbonates. Carbamates are also particularly useful photochemically reactive groups, as amines generally have significantly and/or materially (if not dramatically) different solubilities in mild aqueous acids than do the corresponding unreacted carbamates. Examples of alcohol, phenol and amine protective groups suitable for use as a photochemically reactive group in the present invention include t-BOC, NVOC, Phenoc, Cbz, p-nitrobenzyloxycarbonyl, and others, and described above.

When the photoreactive is a quinone, a group that undergoes a material change in its solubility characteristics is a phenol. Quinone/phenol systems are well known in the art, and similar to the exemplary compositions/photoreactive systems described above, they can be adapted to the present invention. For instance, diazonaphthoquinone (DNQ) photoresist resins generally comprise a phenolic resin having high solubility in aqueous base developers (such as an alkali metal carbonate or hydroxide solution). Mixing such a phenolic resin with a photosensitive diazonapthoquinone renders this mixture insoluble in aqueous developers. Upon light exposure, the diazonaphthoquinone rearranges to a substituted 1-indene carboxylic acid, and the mixture becomes soluble in aqueous developers. Similarly, an embodiment of the current invention may consist of a mixture comprising (i) water-soluble nanoparticles with a remote phenolic group in the ligand or surfactant, and (ii) a photosensitive diazonaphthoquinone configured to render the mixture insoluble in an aqueous base developer. As in conventional DNQ photoresists, such a mixture may become water-soluble (or aqueous base-soluble) upon irradiation with light. In this embodiment, the photoreactive group may comprise a quinone, and the ligand comprises a phenol. Without wishing to be bound by any particular theory, one may consider the quinone to be part of the nanoparticle-ligand complex, where there may be some kind of $\pi$-bonding or aromatic "stacking" between the quinone and the phenol (see, e.g., FIG. 1B, where NP-bound ligand 22 may have a remote phenolic group [not shown in FIG. 1B], and hydrogen- and/or van der Waals-bound ligand 24 may include a photoreactive quinone group 28).

Generally, the present composition further includes a solvent or solvent mixture (hereinafter, "solvent"). The solvent may be protic or aprotic, as long as it does not chemically interfere with the photoreactive group. More preferably, the solvent has a boiling point of about or less than 200° C., preferably about or less than 150° C., at atmospheric pressure. An aprotic solvent generally helps to minimize or avoid a number of potentially undesirable reactions with other components in the composition. A low boiling point helps to remove the solvent efficiently from the composition after coating and/or irradiation. When the solvent comprises or consists essentially of water, the composition generally takes the form of an aqueous colloid, which typically requires a bifunctional ligand, a surfactant and/or charge stabilization. In addition to water, the solvent may also comprise or consist essentially of a polar solvent commonly employed in the industry for spincoating (e.g., PGMEA, EEP, cyclohexanone, butyl acetate, etc.).

The solvent may be selected from the group consisting of alkanes, alkenes, halogenated alkanes, halogenated alkenes, arenes, substituted arenes, alcohols, ethers, cyclic ethers, aliphatic ketones, aliphatic esters, aliphatic amides and aliphatic sulfoxides. Exemplary solvents for the present composition include alkanes (e.g., $C_5$-$C_{12}$ branched or unbranched alkanes and cycloalkanes), alkenes (e.g., $C_6$-$C_{12}$ branched or unbranched alkenes and cycloalkenes), halogenated alkanes (e.g., $C_1$-$C_4$ alkanes having from 1 to 2n+2 halogen substituents and $C_3$-$C_6$ cycloalkanes having from 1 to 2n halogen substituents such as fluorine, chlorine and/or bromine, where n is the number of carbon atoms; preferably $C_1$-$C_2$ alkanes having from 2 to 2n+2 fluorine and/or chlorine substituents), halogenated alkenes (e.g., $C_2$-$C_4$ alkenes having from 1 to 2n halogen substituents and $C_3$-$C_6$ cycloalkenes having from 1 to 2n-2 halogen substituents such as fluorine, chlorine and/or bromine, where n is the number of carbon atoms; preferably $C_2$-$C_3$ alkenes having from 2 to 2n fluorine and/or chlorine substituents), arenes (e.g., benzene), substituted arenes (e.g., N-methylpyrrole or $C_6$-$C_{10}$ arenes having from 1 to 8 halogen substituents and/or $C_1$-$C_4$ alkyl and/or alkoxy substituents; preferably benzenes having from 1 to 6 fluorine, chlorine, $C_1$-$C_2$ alkyl and/or methoxy substituents), alcohols (e.g., $C_1$-$C_6$ branched or unbranched alcohols, preferably $C_1$-$C_4$ branched or unbranched alcohols), aliphatic ethers (e.g., ethers having two $C_2$-$C_6$ branched or unbranched alkyl groups, or 1 methyl group and one $C_4$-$C_6$ branched or unbranched alkyl group), cyclic ethers (e.g., tetrahydrofuran or dioxane), glycol ethers (e.g., of the formula $(CH_3(CH_2)_w)O((CH_2)_nO)_y(CH_2)_nCH_3)$, where x is independently 2-4 [preferably 2], y is 1-4 [preferably 1 or 2], and w and z are independently 0 to 3 [preferably 0]), and aliphatic esters (e.g., $C_1$-$C_6$ branched or unbranched alkyl esters of a $C_2$-$C_{20}$ branched or unbranched, saturated or unsaturated aliphatic acid), and polar aprotic solvents (such as aliphatic sulfoxides; e.g., dimethylsulfoxide).

The present composition may further comprise a surface tension reducing agent, a wetting agent, a surfactant, a binder and/or a thickening agent, although no such additives are required. In fact, it is advantageous for the ink to exclude such additional components, particularly where such additional components include sufficiently high molar proportions of elements such as carbon, oxygen, sulphur, nitrogen, halogen or heavy metals to significantly adversely affect electrical properties of the patterned thin film. However, there may be circumstances where they are advantageous (e.g., to improve thin film morphology, adhesion and/or other properties).

When such additives are present, each of these additional components may be present in trace amounts in the present composition. However, the surface tension reducing agent, which is conventional, may be present in an amount of from 0.001 wt. % to 1 wt. %, preferably 0.002 wt. % to 0.1 wt. % of the composition. In certain embodiments, the surface tension reducing agent may comprise a conventional hydrocarbon surfactant, a conventional fluorocarbon surfactant or a mixture thereof. The wetting agent is generally present in an amount of from 0.05 wt. % to 1 wt. %, preferably 0.1 wt. % to 0.5 wt. % of the composition. In certain embodiments, the wetting agent comprises a fluorinated surfactant and/or a fluorinated hydrocarbon, as described in U.S. application Ser. No. 10/339,741, filed Jan. 9, 2003 and entitled "Nanoparticles and Method for Making the Same", the relevant portions of which are incorporated herein by reference. The surfactant, which may be selected from those described above for the passivation layer, may be present in an amount of from 0.01 wt. % to 1 wt. %, preferably 0.05 wt. % to 0.5 wt. % of the composition. The binder and/or thickening agent, each of which is conventional, may be present in an amount sufficient to provide the composition with predetermined flow and/or adhesion properties at given processing temperatures. However, typical amounts of these components in the composition are from 0.01 wt. % to 10 wt. %, preferably 0.1 wt. % to 5 wt. %.

In a preferred embodiment, the composition further comprises an adhesion promoter. Typically, the adhesion promoter is present in an amount sufficient to improve the adhesion of the subsequently formed thin film to an underlying substrate. The adhesion promoter may comprise a $C_6$-$C_{20}$, branched or unbranched, mono- or polyunsaturated alkene; a $C_8$-$C_{18}$, branched or unbranched, substituted or unsubstituted mono- or polyunsaturated aralkene; a $C_4$-$C_{20}$, branched or unbranched, mono- or polyunsaturated alkenoic acid; a $C_1$-$C_{20}$ branched or unbranched aliphatic alcohol ester or diester of a $C_2$-$C_{20}$, branched or unbranched aliphatic carboxylic acid or dicarboxylic acid, wherein at least one of the aliphatic alcohol and the (di)carboxylic acid contains at least 3 carbon atoms and at least one site of unsaturation; a $C_1$-$C_{20}$ branched or unbranched bis-(aliphatic carboxylic acid) diester of a $C_2$-$C_{20}$, branched or unbranched aliphatic diol, wherein at least one of the aliphatic diol and the carboxylic acid contains at least 3 carbon atoms and at least one site of unsaturation; a $C_4$-$C_{20}$, branched or unbranched, mono- or polyunsaturated aliphatic alcohol or aliphatic mercaptan; and/or a compound of the formula $R^7(CO_2R^8OCH=CH_2)h$ or $R^7(NHCO_2R^8OCH=CH_2)_h$, where $R^7$ is a $C_1$-$C_{20}$ branched or unbranched aliphatic group (a $C_2$-$C_{20}$ branched or unbranched aliphatic group in the compound of the formula $R^7(NHCO_2R^8OCH=CH_2)_h$), or a $C_6$-$C_{20}$ aromatic group that may be substituted with one or more halogen, $C_1$-$C_4$ alkyl, $C_1$-$C_4$ alkoxy, di-$C_1$-$C_4$ alkylamino, or $C_7$-$C_{13}$ aralkyl groups, $R^8$ is a $C_2$-$C_{20}$ branched or unbranched aliphatic, $C_6$-$C_{20}$ branched or unbranched cycloaliphatic, $C_6$-$C_{20}$ aromatic or $C_8$-$C_{20}$ branched or unbranched alkylene-aralkylene bridging group, and h is from 1 to 3, such as 4-vinyloxybutyl benzoate, bis-(4-vinyloxybutyl) adipate, bis-(4-vinyloxybutyl) succinate, 4-(vinyloxymethyl) cyclohexylmethyl benzoate, bis-(4-(vinyloxymethyl) cyclohexylmethyl) glutarate, 4-vinyloxybutyl isophthalate, 4-vinyloxybutyl stearate, tris-(4-vinyloxybutyl) trimellitate, bis-(4-vinyloxybutyl) hexanediylbiscarbamate, bis-(4-vinyloxybutyl) (4-methyl-1,3-phenylene) biscarbamate, and bis-(4-vinyloxybutyl) (methylenedi-4,1-phenylene) biscarbamate (commercially available from Sigma-Aldrich Chemical Co., Milwaukee, Wis.; further examples of which may be commercially available from Hampford Research, Inc., Stratford, Conn.).

Exemplary Methods of Making a (Patterned) Electronically Functional Thin Film

The present invention further relates to methods of making an electronically functional thin film, comprising the steps of (a) irradiating the exemplary composition(s) described above; and (b) curing the irradiated composition to form the electronically functional thin film. Typically, the irradiating step comprises selectively irradiating portions of the composition.

In most embodiments, the method further comprises developing the irradiated composition to form a patterned thin film. The developing step typically occurs after the irradiating step and before the curing step. As is known to those skilled in the art, developing generally comprises removing either irradiated portions (the so-called "positive resist" technique) or non-irradiated portions (the so-called "negative resist" technique) of the functional material layer to form the patterned thin film. Usually, such material is removed with an organic solvent or aqueous developer, which will be discussed in greater detail below.

In most cases, the irradiating step of the method comprises selectively irradiating the exemplary composition(s). Generally, selective irradiation comprises (i) positioning at least one of the substrate and a mask such that predetermined portions can be selectively irradiated (e.g., either the material that is to form the patterned thin film or the material that is to be removed from the thin film, leaving a pattern) and the non-irradiated portions cannot be irradiated, and (ii) irradiating the layer with ultraviolet light through the mask. The mask (also known as a "photomask") is conventional, and typically reproduces a desired pattern of lines, busses, "pads" (which may be used to form an area to which an overlying electronically functional material may make contact, or which may be used to form a capacitor plate), curves, arcs or other geometrical features that can be used to make electrically functional circuit elements (such as inductors, transistors, resistors, capacitors, etc.).

When the method is used to make electrically functional circuit elements that depend at least partially on electrical conductance for functionality (such as busses, inductors, resistors and capacitors), the composition typically comprises metal nanoparticles. When the method is used to make electrically functional circuit elements that depend at least partially on semiconducting properties for functionality (such as transistors, resistors and/or capacitors), the composition typically comprises semiconductor nanoparticles. When the method is used to make electrically functional circuit elements that depend at least partially on dielectric properties for functionality (such as transistors, resistors and/or capacitors), the composition typically comprises dielectric nanoparticles.

In a preferred embodiment, the method comprises developing the selectively irradiated composition(s), and the curing step comprises sintering the developed film to form a patterned electronically functional thin film. For example, the curing step may comprise heating the composition to a temperature of at least about 200° C. (preferably at least about 300° C., and more preferably at least about 400° C.) for a period of time sufficient to remove substantially all of the ligand(s) and/or source(s) of photochemically generated species. Curing has been successfully conducted in air, but may also be performed in or under an inert or reducing atmosphere. Consequently, the curing step may further comprise placing the substrate into a chamber, evacuating the chamber, and/or passing an inert and/or reducing gas into the chamber.

To further improve or retain desirable electrical properties, the method may further comprise heating the electronically functional thin film to a temperature of at least about 200° C. (preferably at least about 300° C.) in the presence of a reducing atmosphere to passivate the electronically functional thin film. This additional step is typically performed after curing, and is particularly advantageous when the composition comprises semiconductor nanoparticles. While not wishing to be bound by any particular theory, it is believed that removing ligands by sintering may leave unbound sites on the surface atoms of the nanoparticle (a so-called "dangling bond"). Heating the sintered thin film in a reducing atmosphere may passivate these chemically unbound sites, thereby reducing or inhibiting the reactivity of the sintered film with other species to which it may be subsequently exposed (e.g., molecular oxygen).

In further embodiments, the method further comprises depositing the exemplary composition(s) described above on a substrate. Depositing is largely conventional, and may be conducted by spin coating, dip coating, extrusion coating, meniscus coating, inkjetting, or spray coating a solution, emulsion or suspension of the composition on the substrate, spin coating being preferred. For examples of deposition processes, see U.S. application Ser. No. 10/007,122, filed Dec. 4, 2001 and entitled "Micro Stencil", U.S. application Ser. No. 10/251,103, filed Sep. 20, 2002 and entitled "Methods for Patterning Using Liquid Embossing", U.S. application Ser. No. 10/215,952, filed Aug. 9, 2002 and entitled "Nanoparticle Synthesis and the Formation of Inks Therefrom", U.S. application Ser. No. 10/339,741, filed Jan. 9, 2003 and entitled "Nanoparticles and Method for Making the Same", and U.S. application Ser. No. 10/616,147, filed Jul. 8, 2003 and entitled "Compositions and Methods for Forming a Semiconducting and/or Silicon-Containing Film, and Structures Formed Therefrom", the relevant portions of which are incorporated herein by reference. The solvent for spin coating may include alcohols, preferably $C_1$-$C_4$ alcohols, and any aprotic organic solvent described above, preferably $C_6$-$C_{10}$ alkanes, alkenes and cycloalkanes, $C_1$-$C_6$ halogenated alkanes and $C_2$-$C_6$ halogenated alkenes, arenes (e.g., benzene), arenes substituted with from 1 to 3 halogen, $C_1$-$C_4$ alkyl, and/or $C_1$-$C_4$ alkoxy groups, ethers (e.g., $C_4$-$C_{20}$ ethers, which may be substituted with one or two $C_1$-$C_4$ alkoxy groups), cyclic ethers (e.g., tetrahydrofuran, dioxane), aliphatic ketones (e.g., $C_3$-$C_{10}$ ketones), aliphatic esters (e.g., $C_1$-$C_6$ aliphatic esters of $C_2$-$C_{12}$ aliphatic carboxylic acids, which may be substituted with from 1 to 3 halogen atoms or a $C_1$-$C_4$ alkoxy group), and mixtures thereof. In various embodiments, the spin coating solvent comprises propylene glycol methyl ether acetate (PGMEA) and ethyl ethoxypropionate (EEP).

Preferred UV radiation sources include those with emissions in the range of 300-450 nm (e.g., high pressure Hg arc lamp, etc.), as are known in the art. In one embodiment, a patterned thin film can be generated by selectively irradiating portions of the uncured composition with UV light through a mask, thereby converting the irradiated portions to a relatively insoluble polymer and leaving the non-irradiated portions of the composition essentially unchanged. Upon developing this layer with a suitable solvent (see the cleaning step below), the unexposed areas are dissolved away, whereas the exposed areas remain relatively intact.

Alternatively, selective irradiation may convert the irradiated portions of the composition to a relatively soluble material in a developer. For example, radiation with UV light may photochemically remove a protecting group from an acid- or base-ionizable photoreactive group (e.g., carbonates of phenols and carbamates of amines as described above, certain photolytically removable protecting groups for carboxylates, etc.). The non-irradiated portions of the composition remain essentially unchanged, and thus, substantially insoluble in aqueous acid or base. Upon developing this layer with a suitable developer, the exposed areas are dissolved away, whereas the unexposed areas remain relatively intact.

In such embodiments of the present method, the depositing substep may comprise spin coating a solution, emulsion or suspension of the composition on the substrate. Furthermore, the irradiating step may further comprise the substep of aligning the mask to an alignment mark on the substrate. A detailed description of an exemplary alignment structure can be found in U.S. patent application Ser. No. 10/171,745, filed Jun. 13, 2002 and entitled "Method of and Apparatus for Aligning a Printing Element to a Substrate", the relevant portions of which are incorporated herein by reference.

Typically, curing times may vary from 10 seconds to 60 minutes (preferably 30 seconds to 30 minutes) depending on the applied temperature and the desired film characteristics (e.g., density or extent of densification, level or percentage of crystallinity, extent to which potential impurities from the ligand and/or photochemically reactive species source are to be removed, impurity level, doping levels, doping profile, etc.) The curing step in the present method may comprise (i) drying the composition and the substrate, and/or (ii) heating the composition.

Sintering of the passivated semiconductor nanoparticles generally occurs at a temperature above 200° C., more preferably above 300° C., and most preferably above 400° C. To lower the sintering temperature, average particle sizes below 10 nm are preferred, more preferably below 5 nm, as described above. Such small nanoparticles may lower the effective sintering temperature range to below 300° C.

As mentioned above, curing (nanoparticle crosslinking and/or sintering) preferably takes place in an inert or reducing atmosphere. Suitable inert atmospheres may include one or more oxygen-free inert gases, such as nitrogen and the noble gases (He, Ne, Ar, Kr, Xe). Reducing atmospheres generally comprise a reducing gas (such as hydrogen, methane, ammonia, phosphine, silane, germane, or a mixture thereof) or a mixture of a reducing gas with an inert gas. When a dielectric film is desired, curing may be conducted in an oxidizing atmosphere, which may comprise an oxygen source, alone or in an inert gas at a concentration effective for oxidizing the electronically functional substance. The oxygen source may comprise dioxygen, ozone, nitric oxide, nitrous oxide, sulfur dioxide, sulfur trioxide, water or a mixture thereof, and the inert gas may be one or more of the inert gases described in this paragraph.

A preferred curing temperature for films formed from the exemplary composition(s) described above is 200° C. or higher, preferably 300° C. or higher. Such temperatures are believed to remove hydrogen and carbon-containing species from the film effectively and/or at a suitable rate, in part to promote nanoparticle crosslinking and/or continuous thin film formation. However, in the case of semiconductor nanoparticles, subsequent lower-temperature annealing of a film formed from a cured composition may improve the film's electrical characteristics. The lower-temperature annealing is generally conducted in a reducing atmosphere (preferably in an argon-hydrogen mixture, more preferably containing ≦10% $H_2$ by weight or moles, and in one implementation, 5 wt. % $H_2$), at a temperature in the range of from 250° C. to 400° C., preferably from about 300° C. to about 350° C., for a length of time of from 1 to 120 minutes, preferably from about 10 to about 60 minutes, and in one implementation about 30 minutes.

After curing or sintering, the method may further comprise cleaning the substrate with the patterned thin film thereon. This step may comprise rinsing with or immersing the substrate in a solvent, draining the solvent from the substrate, and drying the substrate and patterned semiconductor thin film. Solvent rinsing or washing may include the same procedure(s) as are typically used in negative photoresist development and/or photoresist etching (e.g., rinsing, immersing, spraying, vapor condensation, drying, etc.). Preferred solvents include solvents in which the present materials and compounds have a high solubility prior to irradiation, such as the aprotic hydrocarbons and ethers described above for the exemplary solvent(s).

Alternatively, cleaning the substrate may comprise rinsing the substrate with or immersing the substrate in an aqueous base developer, rinsing the developer from the substrate (typically with deionized water), and drying the substrate and patterned thin film. Solvent rinsing or washing may include the same procedure(s) as are typically used in positive photoresist development and/or photoresist etching (e.g., rinsing or immersing, spraying, vapor condensation, drying, etc.). Preferred developers include dilute aqueous solutions of alkali metal carbonates and/or hydroxides (e.g., from 0.1 to 10 N, preferably 0.25 to 5 N KOH, NaOH, $K_2CO_3$, $Na_2CO_3$, $Li_2CO_3$, etc.).

In preferred embodiments, the pattern imparted by selective irradiation comprises a two-dimensional array of lines having a width of from 100 nm to 100 μm, preferably from 0.5 μm to 50 μm, and more preferably from 1 μm to 20 μm. For example, as shown in FIGS. 2, 3, 4 and 5B, the lines may comprise a first set of parallel lines along a first axis, and/or a second set of parallel lines along a second axis perpendicular to the first axis. Although parallel and perpendicular lines are shown (in part to [1] minimize adverse effects from and/or [2] maximize the predictability of the effect of electromagnetic fields from adjacent lines), lines may take any shape and/or take any course that can be designed and patterned.

The lines may have an inter-line spacing of from 100 nm to 100 µm, preferably 200 nm to 50 µm, more preferably 500 nm to 10 µm. Furthermore, at least a subset of the lines may have a length of from 1 µm to 5000 µm, preferably 2 µm to 2000 µm, more preferably 5 µm to 1000 µm, a width of from 0.001 µm to 1000 µm, preferably 0.01 µm to 500 µm, more preferably 0.05 µm to 250 µm and a thickness of from 0.025 µm to 100 µm, preferably 0.05 µm to 25 µm, more preferably 0.1 µm to 5 µm.

In more detailed embodiments, the composition may be at least partially cured when heated to a temperature and/or for a length of time sufficient to remove passivation and begin forming covalent bonds between nanoparticles. Such heating is generally conducted under an inert or reducing atmosphere (as described above), and may take place under a vacuum (e.g., less than or about 100 Torr, preferably less than or about 10 Torr, more preferably less than or about 1 Torr) or in a flow of inert or reducing gas.

The method may further comprise patterning the thin film, largely by conventional photolithographic methods.

Exemplary Electronically Functional Thin Film Structures

A further aspect of the invention relates to a thin film structure comprising a pattern of an electronically functional material on a substrate, the electronically functional material comprising sintered, photodefined nanoparticles of an electronically functional substance and having, prior to photo-definition and sintering, a ligand containing a group that is reactive with a photochemically generated species and which, after reacting with the photochemically generated species, materially changes the solubility characteristics of the nanoparticles in a developer. In preferred embodiments, the nanoparticles comprise semiconductor nanoparticles or metal nanoparticles or dielectric nanoparticles.

The present invention provides thin films having properties approaching or similar to those of conventional thin films and/or bulk materials, but (as described above) without all of the conventional thin film processing steps. For example, the thin film may have a resistivity no more than ten times that of a corresponding bulk metal, preferably no more than about five times that of the corresponding bulk metal. The thin film may also have improved resolution relative to an otherwise identical structure made either (1) by an identical process, but in which the nanoparticles do not contain the (photo)reactive group, or (2) from identical nanoparticles, but by a graphic arts-based printing process. Furthermore, the method may have better and/or comparable throughput rates relative to an otherwise identical structure made from identical nanoparticles, but by a graphic arts-based printing process.

In the present thin film structure, either or both of the nanoparticles and the ligand may further comprise a dopant (e.g., B, P or As where the nanoparticles comprise a semiconducting material) covalently bound thereto. In such a case, the dopant concentration profile or gradient is expected to be substantially uniform throughout the entire thickness of the semiconductor thin film. However, in the case where the ligand comprises a dopant but the nanoparticles do not, the sintered thin film may comprise small crystalline phases or regions (preferably less than about 10 nm average diameter, more preferably less than about 5 nm average diameter) that are substantially free of dopant, but are embedded in a matrix of otherwise uniformly doped semiconducting material.

The pattern of the present thin film structure has been described in part above with regard to the present method. However, in a preferred embodiment, the present thin film structure pattern comprises a two-dimensional array of lines having a width of from 100 nm to 100 µm, more preferably from 0.5 µm to 50 µm, and even more preferably from 1 µm to 20 µm. The lines may have an inter-line spacing of from 100 nm to 100 µm, preferably from 0.5 µm to 50 µm, more preferably from 1 µm to 20 µm. The thin film pattern lines may also have a length of from 1 µm to 5000 µm, at least a subset of the lines preferably having a length of from 2 µm to 1000 µm, more preferably from 5 µm to 500 µm. The lines may have a thickness of from 0.001 µm to 100 µm, preferably from 0.005 µm to 50 µm, more preferably from 0.05 µm to 10 µm.

Experimental Example #1

A series of experimental tests were performed to determine the viability of the present radiation patternable functional materials, compounds, compositions and method(s). Silver nanoparticles capped with oleic acid ligands were prepared according to a conventional process (see, e.g., U.S. application Ser. No. 10/215,952, filed Aug. 9, 2002 and entitled "Nanoparticle Synthesis and the Formation of Inks Therefrom", and were dissolved in xylene (50 wt. %). A series of binders (ethylene glycol diacrylate, 1,6-hexanediol diacrylate, 1,9-decadiene and 1,7-octadiene, 10.0 wt. %) were individually combined with the stock Ag nanoparticle-oleic acid complex (20.0 wt. % Ag, 5.0 wt. % oleate ligand) in a solvent or solvent mixture (about 43.2 wt. %) with a photoinitiator (IRGACURE 184 or IRGACURE 369; about 1.8 wt. %). Neither the dienes nor the photoinitiators caused the Ag-oleic acid nanoparticles to precipitate out of solution.

Typically, in a standard "droplet on glass" test, the stock Ag-oleic acid nanoparticle solution forms a wetting droplet on a glass plate which, after drying as described above, has a rough surface with non-penetrating cracks. Either with or without a binder, test solutions containing IRGACURE 184 formed a mirror finish, but with penetrating cracks of significant size (length ~10-50 um and width ~0.5-2 um). Addition of butyl ether and/or substitution of butyl ether for xylene improved the glass-wetting properties of the composition. Test solutions containing 1,9-decadiene tended to dewet the solution from the glass, while test solutions containing 1,7-octadiene wet the glass satisfactorily. Test solutions containing 1,7-octadiene had satisfactory spin-coating properties, but a foggy surface appearance and microcracks were sometimes observed.

Test compositions were spin-coated onto a glass slide and exposed through a test image mask (using a Karl Suss MA6 mask aligner) to 275 W of UV light from a broadband, high pressure mercury lamp for 10 minutes, under an inert $N_2$ atmosphere (and, in some cases, either under slight vacuum or slight overpressure). Latent images were created in all test compositions containing either photoinitiator, with or without a binder. In the absence of a photoinitiator, no latent images were observed (even after 40 min. irradiation). Feature resolution was satisfactory, even at feature sizes (e.g., widths) of 3 to 5 µm. Backside irradiation confirmed that UV light, and not physical contact of the mask, was responsible for forming the latent image.

The latent images were developable with acetone, isopropyl alcohol and methanol, acetone giving the best results.

The most satisfactory edge resolution was observed at 20-30 microns. The developed latent images had smaller cracked grain sizes than the undeveloped, non-irradiated regions. Pre-development heating at 100° C. for 2-10 min. tended to prevent subsequent development with acetone. Exposure of the film to toluene vapor reduced the size of or eliminated cracks in the film, either before or after irradiation, and before or after development. However, toluene vapor exposure before acetone development tended to convert a negative latent image into a positive latent image.

Experimental Example #2

A series of experimental tests were performed to determine the viability of a second embodiment of the present radiation patternable functional materials, compounds, compositions and method(s). The same silver nanoparticle-oleic acid complex stock solution as for Experimental Example #1 was used. Stock solutions of 2,6-bis(4-azidobenzylidene)-4-methylcyclohexanone (5 wt. %) dissolved in xylene or butyl ether were prepared. A series of adhesion promoters (oleic acid, ethyl oleate, and 1,7-octadiene, 50.0 wt. %) were individually combined with a stock azide solution, then mixed with the stock Ag nanoparticle-oleic acid complex solution, dihydroterpineol and 3-octanol (as anti-cracking agents) in xylene (50 µl of a stock solution of a silver nanoparticle-oleic acid complex, prepared as in Experimental Example #1, in butyl ether (containing 30 wt. % Ag and 0.6 wt. % Pd) is combined with 1 drop of a ~40 wt. % solution of adhesion promoter in butyl ether, 3 drops of stock azide solution, 1 drop of 3-octanol and 1 drop of dihydroterpineol), then 50 µl of the mixture was spin coated at 3000 RPM for 30 sec. onto clean 1737 Corning glass plates. The films were generally baked at 120° C. for 10 minutes before irradiation to remove solvent. The baked films were exposed to 350 W of UV irradiation from a broadband, high pressure mercury lamp through a test mask for 5-10 min under inert $N_2$ atmosphere with a slight overpressure. The irradiated films were then developed by immersion for 10 seconds into each of two clean baths of toluene or acetone, or alternatively, by rinsing with toluene for 5 seconds from a squeeze bottle.

Figure 2:
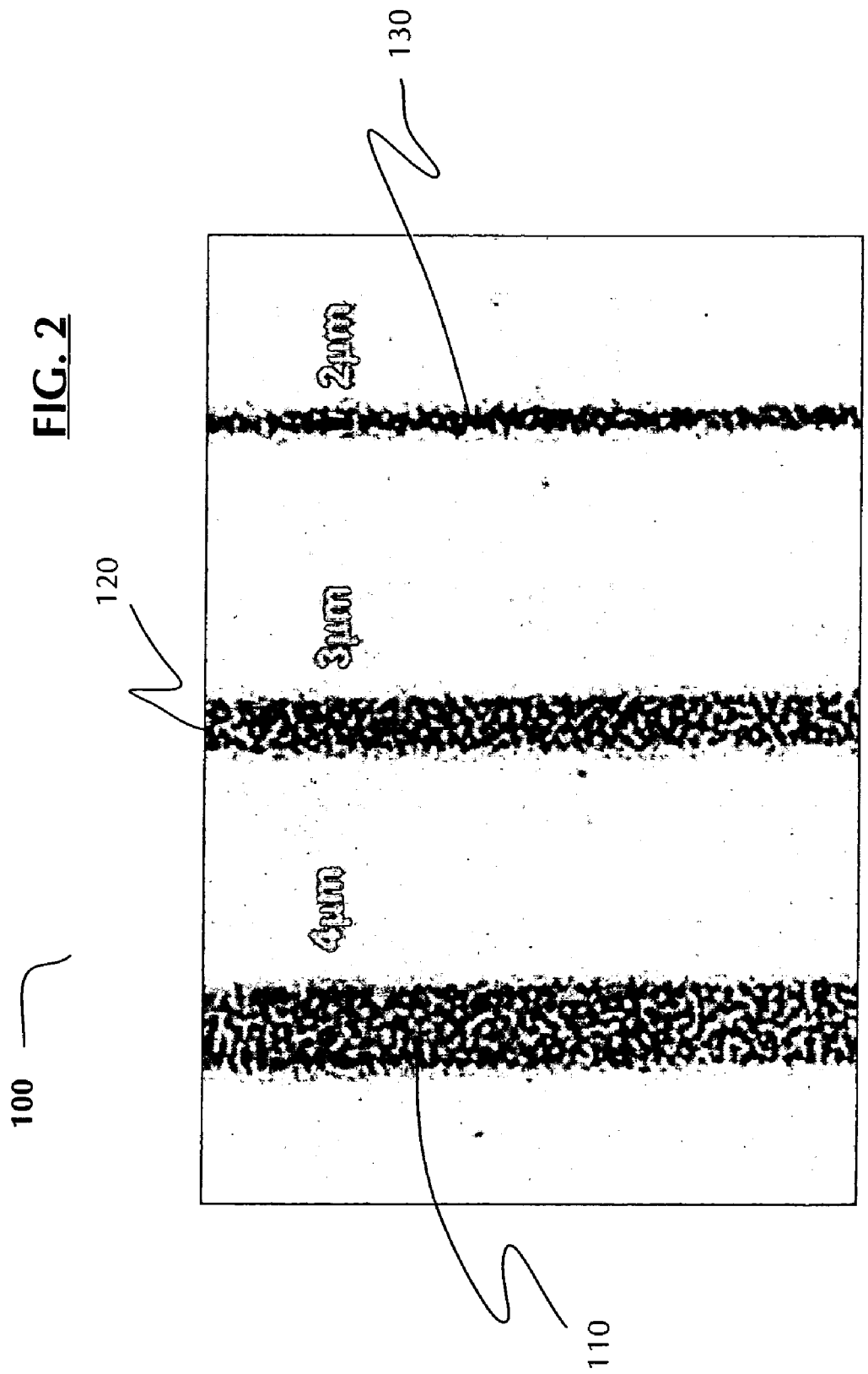
FIG. 2 shows a first embodiment of the present invention in which thin film lines of varying widths are made.

As shown in FIG. 2, toluene-developable images 100 were formed from compositions containing the azide, Ag nanoparticle-oleate complex and any of the adhesion promoters described above. It is noted that the exemplary azide of this example has a limited solubility in xylene that can keep its concentration below 5 wt. % in the final composition. Images 100 having lines 110, 120 and 130 were formed either with or without pre-exposure baking. Resolution was satisfactory for features having widths down to 2 µm (see, e.g., line 130) and inter-feature spacing down to 3 µm (not shown). The developed patterned film had a thickness of generally about 21 nm, but some residue was observed in the non-irradiated portions of the pattern, which may have limited the contrast on which the film thickness measurements were taken and/or based. However, patterned, developed thin films had a resistivity of about 14.7 µOhm-cm, about 8.6 times that of bulk silver. Certain films exhibited some cracking, and it is believed that reducing this cracking will improve the conductivity of the film. It was also found that these exemplary compositions could be developed with butyl acetate, even 4 days after irradiation. In a control experiment, omitting the azide resulted in no developable pattern forming, even with the pre-exposure heating step.

Some interesting properties of certain compositions were observed. For example, compositions containing azide and free oleic acid binder generally benefited from a pre-exposure heating step. Heating for 5 min. at 100° C. was insufficient to form an image after irradiation. The film also tended to wash off the plate during development. Heating for 5 min. at 140° C. was sufficient to form an image after irradiation and a film that adhered to the plate during development, but also tended to leave noticeable amounts of residue in the non-irradiated portions of the film. Consequently, heating for 5-10 min. at 115-120° C. is sufficient to form an image after irradiation, adhere the film to the plate during development, and leave the smallest amount of residue in the non-irradiated portions of the film.

Compositions without a binder formed latent images after irradiation, but had insufficient adhesion to the glass to be adequately developed with toluene, even with a 5 min., 130° C. heat treatment prior to irradiation. Ethyl oleate reduced the number and size of cracks in the film, oftentimes eliminating cracks completely, even in the absence of 3-octanol. However, edge definition and resolution are generally not as good as with oleic acid as the binder, and the patterned, developed film generally has higher resistivity.

A preferred developer is 1:1 (by volume) toluene:butyl acetate. Metal films were generally about 30% thicker (38 nm vs. 30 nm) using 1:1 toluene:butyl acetate, as compared to toluene alone. Edge resolution and film and feature adhesion and morphology were also superior when a toluene:butyl acetate developer was used, as compared to toluene alone.

Experimental Example #3

As a result of the experimental tests performed above, a baseline process was defined. The stock azide solution is prepared as follows. Three brown glass vials are cleaned by successive toluene, acetone and toluene shakes, and the vials are dried under vacuum. 0.2 g of azide are added to 2.0 g of p-xylene in one glass vial and the mixture is shaken for 1 min. at 2400 RPM using a mechanical shaker. The shaken mixture is filtered through a 0.4 micron Teflon filter into a second vial to yield 1.75 g of solution. 1.0 g of butyl ether is added to the second vial, shaken again as above for 1 min., then filtered again as above into the third vial to yield 2.6 g of stock azide solution.

The photodefinable functional film composition is prepared as follows. 50 µl of a stock solution of a silver nanoparticle-oleic acid complex, prepared as in Experimental Example #1, in butyl ether (containing 30 wt. % Ag and 0.6 wt. % Pd) is combined with 1 drop of a 38 wt. % solution of oleic acid in butyl ether, 3 drops of stock azide solution and 2 drops of 3-octanol, yielding a composition containing 45.9 wt. % of the nanoparticle stock solution, 10.0 wt. % of oleic acid solution, 25.8 wt. % of azide stock solution and 18.3 wt. % of 3-octanol. 75-100 µl of the composition is spin coated onto Nanofilm-cleaned 1737 Corning glass plates via micropipette to the exact center of a spin stage at 1100 RPM for 30 sec. The film is baked at 115° C. for 5 minutes on a Brewer Science 100CB hotplate.

The mask is cleaned by a toluene spray and light cloth rub, followed by another toluene spray and drying by passing $N_2$ gas over the mask and heating for 5 min. on the Brewer hotplate at 115° C. The mask is placed in a Karl Suss MA6 mask aligner in "Lo Vacuum Contact" mode with $N_2$ overpressure. The masked film is exposed to 350 W of UV irradiation for 5-10 min. to provide about 18 mW/cm² of broadband intensity measured at 154, 310 and 365 nm. Exposures in every experiment described herein were conducted according to this procedure. The irradiated film is developed by successive immersion into each of three clean baths of toluene or 1:1 toluene:butyl acetate for 5, 10 and 5 seconds. The developed film is dried by passing $N_2$ gas over the plate, then cured for 10 min. in a 300° C. oven (e.g., a rapid thermal anneal oven).

This baseline process provides irradiated films without cracks, and patterned Ag thin films with acceptable micromorphology, smooth feature edges and a small (but apparently immaterial) amount of residue in non-irradiated regions (about 5 nm or less). Irradiation for 5 min. generally yields a thin film having a thickness of about 30 nm; irradiation for 10 min. generally yields a thin film having a thickness of about 40 nm and a resistivity of about 8.8 μOhm-cm, about 5 times that of bulk silver.

Experimental Example #4

A series of further experiments were performed, generally using the baseline process described above in Experimental Example #3, but with a series of different adhesion promoters to determine the effects thereof.

The thin film-forming composition containing cis-9-oleic acid gave UV latent images and a toluene-developable pattern, but if given enough time, it tended to desolubilize the Ag-oleic acid nanoparticle complex, although its solubility in the thin film-forming composition was good. Cracks could be observed in the spin-coated film in the absence of 3-octanol, but these cracks were not observed in the presence of 3-octanol.

The thin film-forming composition containing trans-9-oleic acid gave a toluene-developable pattern, but satisfactory adhesion to glass was not always observed (occasionally some features were damaged and/or inadvertently removed in development). Solubility of this binder in the composition was good, although cracks were observed in the heated, spin-coated film prior to irradiation.

The thin film-forming composition containing ethyl oleate gave a toluene-developable pattern, but with relatively high resistivity. It also tended to desolubilize the Ag-oleic acid nanoparticle complex over time, although no cracks were observed in the spin-coated film, either before or after pre-irradiation heating.

The thin film-forming composition containing stearic acid gave weak latent UV images and a toluene-developable pattern, but commercially satisfactory adhesion to glass was not as reproducible as is desired (occasionally some features were damaged and/or inadvertently removed in development). Solubility of this binder in the composition was good, but since stearic acid is a solid at room temperature, it had to be dissolved in solution prior to mixing with the remaining components of the composition, resulting in a weight percentage of 0.9% of the binder in the composition. No cracks were observed in the spin-coated film, either before or after pre-irradiation heating.

The thin film-forming composition containing 1-dodecene tended to eventually desolubilize material in the composition, given enough time, although its solubility in the thin film-forming composition was good. A second thin film-forming composition containing 4 wt. % 1-dodecene and 4 wt. % oleic acid appeared to give UV latent images and did give a high resolution, toluene-developable pattern. An immaterial number of cracks were observed in the spin-coated film after pre-irradiation heating.

The spin-coated thin film-forming composition containing linoleic acid was badly cracked after pre-irradiation heating, but it yielded relatively thick features after toluene development. The solubility of linoleic acid in the composition was good.

From these experiments, it is believed that oleic acid gives the best results. Results may be further improved with a combination of binders that includes oleic acid.

Experimental Example #5

A series of further experiments were performed, using the baseline process described above, and the compositions (and process changes) defined in Table 1 below. In each case, UV exposure was for 5 min. The results of baseline process #1 (oleic acid binder and toluene developer) and baseline process #2 (oleic acid binder and 1:1 toluene:butyl acetate developer) are respectively shown in FIGS. 3 and 4, as well as in Table 1. Results of a palmitoleic acid binder process are shown in FIGS. 5A-5B. Results of an oleic acid:dodecene binder process (other than as shown in Table 1) will be described relative to these figures.

TABLE 1

Experimental Example #5 formulations, conditions and results.

| Adhesion Agent | Oleic Acid | Oleic Acid (w/1:1 butyl acetate:toluene developer) | Oleic Acid/ Dodecene | Palmitoleic Acid |
|---|---|---|---|---|
| Formulation (all amounts in wt. %): | | | | |
| Bis-azide | <<1% | <<1% | <<1% | <<1% |
| Adhesion agent | 3.7% | 3.0% | 3.8% oleic acid, 10.0% dodecene | 4.4% |
| Ag nanoparticles | 13.8% | 14.4% | 15.6% | 18.0% |
| Surfactant & Pd | 2.8% | 3.0% | 3.2% | 3.7% |
| Butyl ether | 46.1% | 45.6% | 51.0% | 56.9% |
| Xylene | 15.6% | 15.0% | 17.4% | 18.0% |
| 3-Octanol | 18.0% | 19.0% | — | — |
| Processing: | | | | |
| Spin coat | 100 μL | 50 μL | 50 μL | 75 μL |
| Development | 20 sec, toluene bath | 0 rpm, 12 sec; 3000 rpm, 30 sec | 20 sec, toluene bath | (none) |

TABLE 1-continued

Experimental Example #5 formulations, conditions and results.

| Adhesion Agent | Oleic Acid | Oleic Acid (w/1:1 butyl acetate:toluene developer) | Oleic Acid/ Dodecene | Palmitoleic Acid |
|---|---|---|---|---|
| Results: | | | | |
| Pattern thickness (nm) | 30 | 36 | 21 | 80 |
| Pattern roughness (nm Ra) | 6.8 | 6.4 | 5.8 | 4.2 |
| Resistivity (µOhm-cm) | 17 | 9 | 14 | <4.0 |

Figure 3:
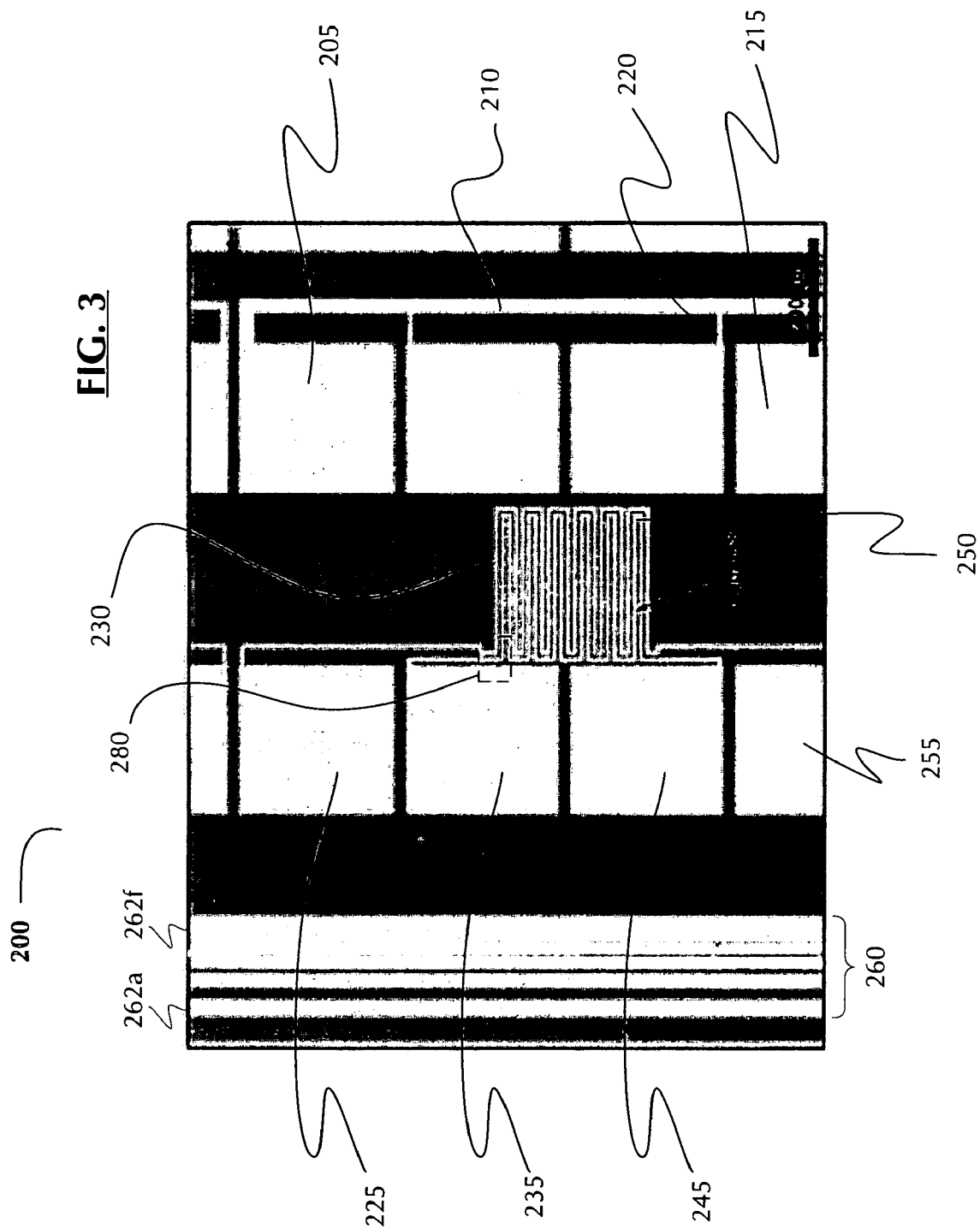
FIG. 3 shows a second embodiment of the present invention in which a conducting thin film structure is made.

FIG. 3 shows a number of test patterns formed from baseline process #1. For example, pads 205 and 215 are connected by a bus 210 to form a pattern suitable for one type of resistivity test. Similarly, pads 225 and 255 are connected by a 5 µm-wide serpentine resistor 230, and pads 235 and 245 are connected by a 5 µm-wide serpentine resistor 240, forming a pattern suitable for another type of electrical test (as well as for determining edge and feature definition and morphology). Inter-line spacing between resistors 230 and 240 is about 3-5 µm. A pattern 260 of successively closer-spaced metal lines 262a-262f is suitable for determining minimum inter-feature spacing, which in the case of baseline process #1, is about 3 µm.

Figure 4:
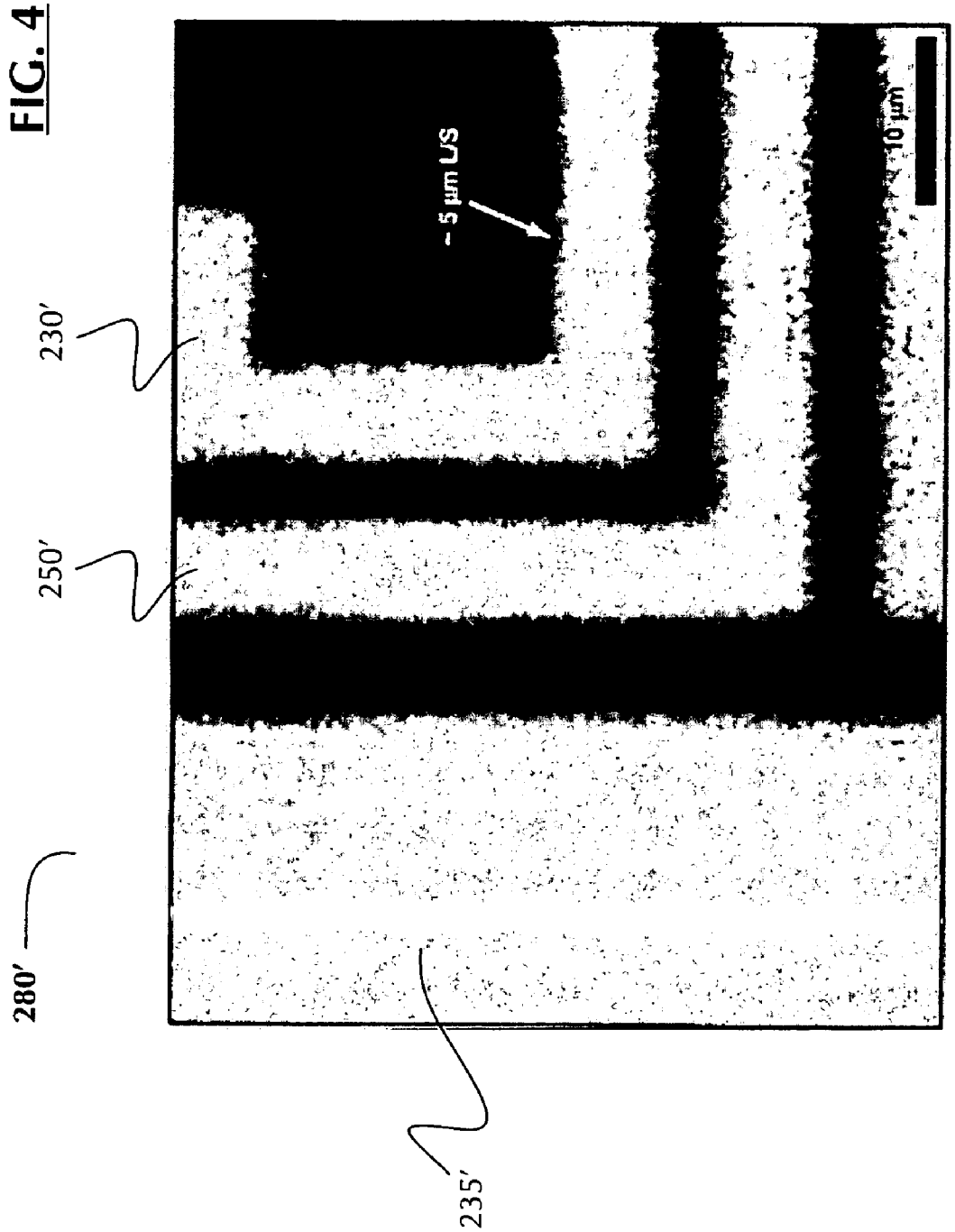
FIG. 4 shows a variation of the second embodiment of the present invention in greater detail.
Figure 5A:
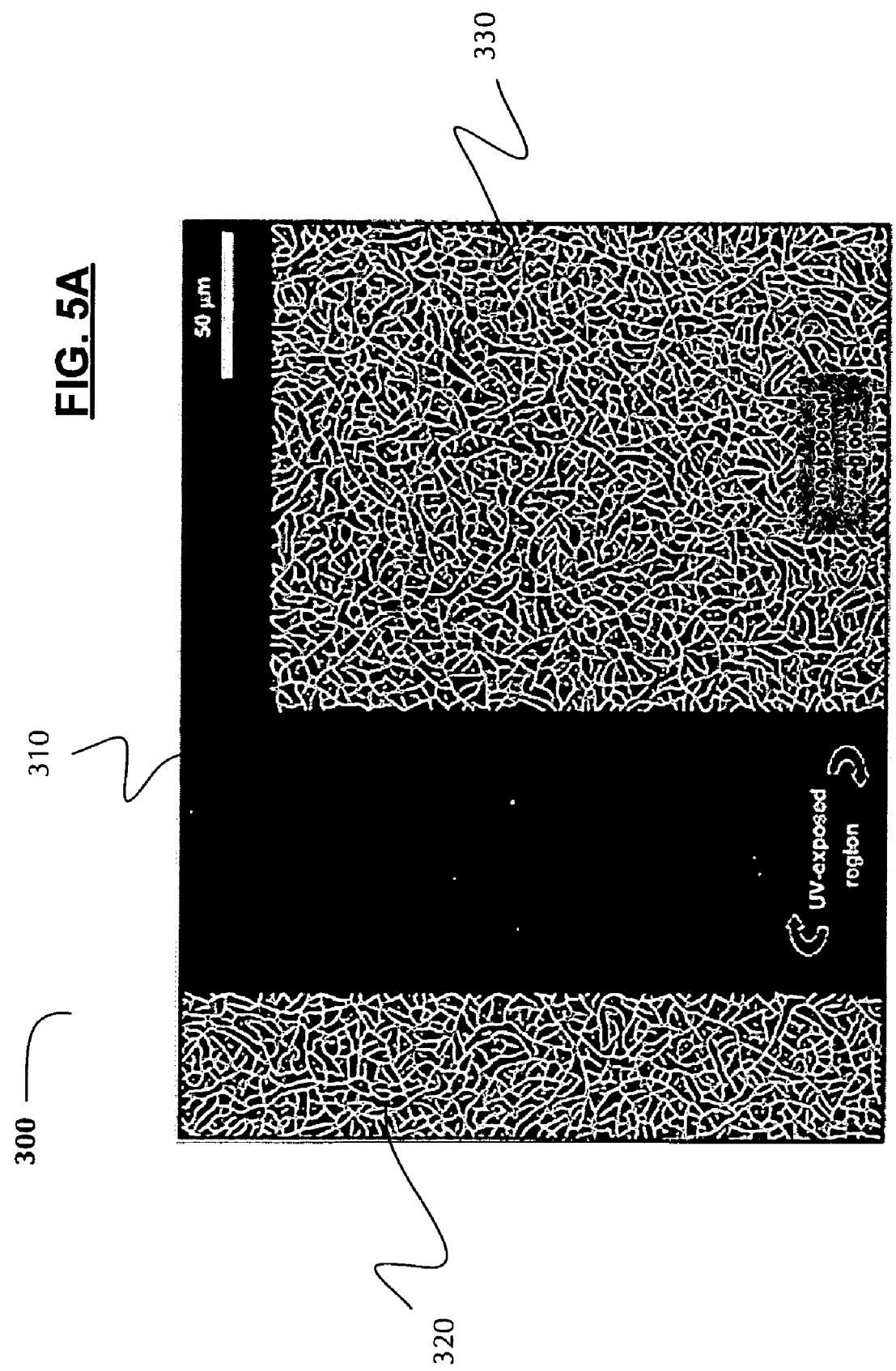
FIGS. 5A-5B show two examples of a third embodiment of the present invention.
Figure 5B:
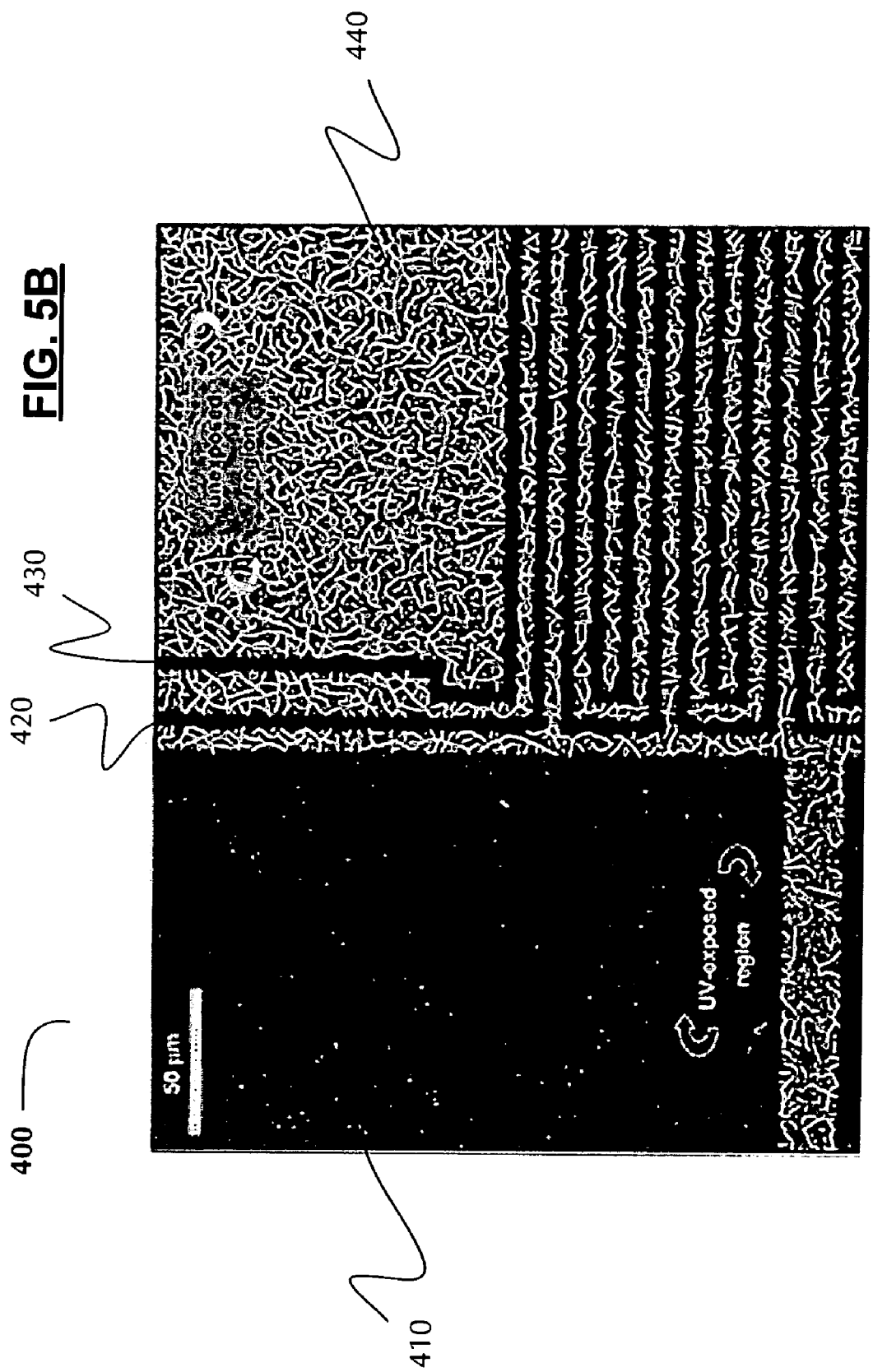

FIG. 4 shows the improved edge definition and film morphology provided by baseline process #2. The area 280' shown corresponds to area 280 from FIG. 3 (baseline process #1). Resistor lines 230' and 250', and pad 235', show excellent edge definition and no detectable cracks. The film produced using the oleic acid:dodecene binder process, while electrically functional, exhibited some cracking and some "holes" that were apparently formed during curing (perhaps a result of metal "pulling apart" as organic material is removed).

FIGS. 5A and 5B show an interesting morphology to the non-irradiated portions 320 and 330 of irradiated, cured film 300 formed from the palmitoleic acid binder process. Irradiated region 310 shows excellent conductivity and film morphology, but non-irradiated portions 320 and 330 show severe, extensive cracking and exhibit a resistivity at least about ten times that of irradiated region 310. Consequently, the palmitoleic acid binder process does not need to be developed in order to form electronically functional, patterned thin films.

Referring now to FIG. 5B, non-irradiated portions (e.g., 440) of film 400 adequately and effectively insulate irradiated portions 410, 420 and 430 (which have essentially the same pattern as the serpentine resistors and connected pads of FIG. 3). By changing the width of the resistor in the corresponding mask, one may effectively create a "mask programmable" resistor that can be used for a number of different applications, including signal processing or transmission speed, voltage control, even programmable memory (e.g., a memory cell in which a "programmable resistor" element is present or absent, to generate one or two possible memory states).

CONCLUSION/SUMMARY

Thus, the present invention provides a radiation patternable, electrically functional thin film structure and a composition, ink and method for making such thin films and compositions. It is also envisioned that the present composition and method can be used for other thin film structures, such as corresponding oxides. The present invention advantageously provides thin film structures having improved physical and/or electrical properties (e.g., film uniformity, film morphology and/or feature resolution), relative to structures made from nanoparticles without the (photo)reactive group or from similar nanoparticle inks using conventional graphic arts printing processes. Direct photolithographic processing of electronically functional materials provides numerous advantages over prior methods, such as avoiding conventional metal deposition steps, that can adversely affect resolution, yield and throughput rates. The present composition advantageously provides conducting, semiconducting and insulating thin film structures having qualities suitable for use in electronics applications, such as display devices or RF ID tags, while enabling use of high-throughput, high-resolution, high-quality, high-yield photolithographic processes for manufacturing such devices.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A radiation patternable functional material, comprising a compound of the formula (1):

$(R^1-X^1)_m NP(X^2-R^2-Y)_n,$     (1)

where NP comprises a nanoparticle of an electronically functional substance selected from the group consisting of semiconductors and metal; Y is a group that is photoreactive or that is reactive with a photochemically generated species and which, after first-order photoreaction or reacting with said photochemically generated species, materially changes the solubility characteristics of said compound in a developer; $X^1$ and $X^2$ are independently a nanoparticle-binding group; $R^1$ is a monovalent group that is not reactive with said photochemically generated species; $R^2$ is a divalent bridging group; m is at least 0, and the m instances of $R^1-X^1$ may be the same or different; n is at least 1, and the n instances of $X^2-R^2-Y$ may be the same or different; and m+n is at least 2; wherein, after irradiation, developing and curing, the functional material forms a patterned film of an electronically conducting or semiconducting material.

2. The material of claim 1, wherein said electronically functional substance comprises a metal that absorbs a first wavelength of UV light.

3. The material of claim 2, wherein said photoreactive group or group that is reactive with said photochemically generated species absorbs a second wavelength of UV light significantly different from said first wavelength of UV light.

4. The material of claim 3, wherein said electronically functional substance comprises one or more members of the group consisting of transition metals, noble metals, aluminum, indium tin, lead, and alloys thereof.

5. The material of claim 4, wherein said electronically functional substance comprises one or more members of the group consisting of Cr, Mo, W, Fe, Ru, Ni, Pd, Pt, copper, silver, gold, and aluminum.

6. The material of claim 5, wherein said electronically functional substance comprises nickel, copper, silver or gold.

7. The material of claim 3, wherein Y contains a group that is reactive with said photochemically generated species and that, after reacting with said photochemically generated species, materially changes the solubility characteristics of said material in said developer.

8. The material of claim 7, wherein said photoreactive group comprises a quinone, and said ligand comprises a phenol.

9. The material of claim 1, wherein said electronically functional substance comprises one or more members of the group consisting of silicon, germanium, CdS, CdSe, InP, InAs and GaAs.

10. The material of claim 9, wherein said electronically functional substance comprises silicon.

11. The material of claim 1, wherein said nanoparticle-binding group is a member selected from the group consisting of an alcoholate, a thiolate, a disulfide, a carboxylate, a carboxylic acid, an amine, a phosphine, a phosphine oxide and an alkyl group.

12. The material of claim 1, wherein Y is said group that is reactive with said photochemically generated species, and is selected from the group consisting of a carbon-carbon double bond, an epoxide, an oxirane, an aziridine, a phenol, a carbonate and a carbamate.

13. The material of claim 12, wherein said group that is reactive with said photochemically generated species comprises said carbon-carbon double bond, and said carbon-carbon double bond is selected from the group consisting of a vinyl group, an activated carbon-carbon double bond, an acrylate, and a vinyl ketone.

14. The material of claim 1, wherein said nanoparticle has an average diameter of less than 100 mm.

15. The material of claim 1, wherein said nanoparticle has an average diameter of less than 10 nm.

16. The material of claim 1, wherein said nanoparticle has an average diameter of less than 5 nm.

17. The material of claim 1, wherein said photochemically generated species has an ultraviolet absorption maximum at a first wavelength and said nanoparticle has an ultraviolet absorption maximum at a second wavelength, said second wavelength significantly differing from said first wavelength.

18. The material of claim 17, wherein said photoreactive group comprises an azide, said first wavelength is one at which a mercury arc lamp has a relatively strong irradiance, and said nanoparticle comprises a metal having a relatively poor absorbance at said first wavelength.

19. The material of claim 1, wherein said electronically functional substance consists essentially of silicon and/or germanium.

20. The material of claim 1, wherein said electronically functional substance comprises one or more members of the group consisting of transition metals, noble metals, aluminum, indium, tin, lead, and alloys thereof.

21. The material of claim 20, wherein said electronically functional substance consists essentially of nickel, copper, silver or gold.

22. The material of claim 1, wherein $R^1$ is alkyl, cycloalkyl, aryl or aralkyl, any one of which may be substituted one or more times with a halogen or with a substituent selected from the group consisting of alkyl (except where $R^1$=alkyl), cycloalkyl, aryl, aralyl (except where $R^1$=alkyl), alkoxy, alkylthio, alkylcarbonyl, alkoxycarbonyl, alkylcarboxy, alkylamino, dialkylamino, alkylamido, dialkylamido, cycloalkoxy, cycloalkylthio, cycloalkylcarbonyl, cycloalkoxycarbonyl, cycloalkylcarboxy, cycloalkylamino, di(cycloalkyl)amino, (cycloalkyl)(alkyl)amino, cycloalkylamido, di(cycloalkyl)amido, (cycloalkyl)(alkyl)amido, aryloxy, arylthio, arylcarbonyl, aryloxycarbonyl, arylcarboxy, arylamino, diarylamino, (aryl)(alkyl)amino, arylamido, aralkoxy, aralkylthio, aralkylcarbonyl, aralkoxycarbonyl, aralkylcarboxy, aralkylamino, diaralkylamino, (aralkyl)(alkyl)amino, heterocyclyl, trialkylsilyl, and trialkylsilyloxy, each of which may be further substituted with one or more halogens, alkyl groups (except for alkyl substituents on $R^1$) and/or alkoxy groups.

23. The material of claim 22, wherein $R^1$ is $C_4$-$C_{20}$ alkyl which may be substituted one or more times with a halogen, a $C_1$-$C_6$ alkoxy, $C_3$-$C_8$ cycloalkyl, phenyl and/or $C_7$-$C_{20}$ aralkyl, each of which (except for halogen) may be further substituted with one or more halogens, $C_1$-$C_6$ alkyl groups and/or $C_1$-$C_6$ alkoxy groups.

24. The material of claim 1, wherein $R^2$ is selected from the group consisting of alkylene, alkyleneoxy, alkyleneoxyalkylene, alkyleneoxyalkylencoxy, alkylenethio, alkylenethioalkylene, alkylenecarbonyl, alkyleneoxycarbonyl, alkylenecarboxy, alkyleneanino, alkylene(alkyl)amino, alkylene(alkyl)aminoalkylene, alkyleneaniido, alkylene(alkyl)amido, cycloalkylene, cycloalkylencoxy, cycloalkylencthio, cycloalkylenecarbonyl, cycloalkyleneoxycarbonyl, cycloalkylenecarboxy, cycloalkylencamino, (cycloalkylene)(alkyl)amino, cycloalkyleneamido, (cycloalkylene)(alkyl)amido, arylene, alkylene-arylene, alkylene-arylene-alkylene, aryleneoxy, alkyleneoxyarylene, alkylene-aryleneoxy, aryleneoxyalkylene, arylenethio, alkylene-arylenethio, arylenethioalkylene, arylenecarbonyl, alkylene-arylenecarbonyl, aryleneoxycarbonyl, alkylcne-aryleneoxycarbonyl, arylenecarboxy, alkylenc-arylenecarboxy, arylencamino, alkylene-aryleneamino, arylene(aryl)-amino, alkylenearylene(aryl)amino, arylene(alkyl)amino alkylene-arylene(alkyl)amino, alkylene(aryl)amino, aryleneamido, aralkylene, aralkyleneoxy, (alkylene)aralkyleneoxy, aralkylenethio, aralkylenccarbonyl, aralkyleneoxycarbonyl, aralkylenecarboxy, aralkyleneamino, aralkylene(aryl)amino, (aralkylene)(alkyl)amino, (alkylene)(aralkyl)amino, heterocyclylene, alkylene-heterocyclylene, and alkylene-hetcrocyclylene-alkylene, each of which may be further substituted with one or more halogens, alkyl groups (except where $R^2$=alkylene), alkoxy groups, trialkylsilyl, and/or trialkylsilyloxy groups.

25. The material of claim 24, wherein $R^2$ is selected from the group consisting of alkylene, alkylene substituted with one or more halogens and/or alkoxy groups, alkyleneoxy, alkyleneoxyalkylene, alkylcneoxyalkyleneoxy, alkylene(alkyl)amino, cycloalkylene, arylene, arylene substituted with one or more halogens, alkyl groups and/or alkoxy groups, aryleneoxy, arylenethio, arylene(alkyl)amino, aralkylene, (alkylene)aralkylene, and aralkylene(alkyl)amino.

26. The material of claim 25, wherein $R^2$ is selected from the group consisting of $C_4$-$C_{20}$, branched or unbranched, saturated or unsaturated alkylene groups; $C_7$-$C_{17}$, branched or unbranched, substituted or unsubstituted aralkylene groups; $C_4$-$C_{20}$, branched or unbranched, saturated or unsaturated alkyleneoxy groups; and $C_4$-$C_{20}$, branched or unbranched, saturated or unsaturated alkylene thio groups.

27. The material of claim 1, wherein Y is reactive with a photochemically generated species and which, after reacting with said photochemically generated species, materially changes the solubility characteristics of said material in said developer.

28. The material of claim 27, wherein Y is selected from the group consisting of a carbon-carbon double bond, an epoxide, an oxirane, an aziridine, and a phenol.

29. The material of claim 27, wherein Y is selected from the group consisting of a vinyl group, a vinylidene group, an epoxide, a carbonate, a carbamate and a phenol.

30. The material of claim 29, wherein Y comprises a vinyl group or a vinylidene group substituted with a halogen, a $C_1$-$C_6$ alkyl group, a $C_1$-$C_6$ alkoxy group, a phenyl group, a phenyl group substituted with one or more halogens, $C_1$-$C_6$ alkyl groups, $C_1$-$C_6$ alkoxy groups and/or di-($C_1$-$C_6$ alkyl) amino groups, a —C(═O)—$C_1$-$C_6$ alkyl group, a —C(═O)—$C_1$-$C_6$ alkoxy group, or a cyano group.

31. The material of claim 1, wherein $X^1$ and $X^2$ are independently a chalcogen, a carboxylate group, a carboxylic acid group, a thiocarboxylate group, a thiocarboxylic acid group, an alkylene group, $NR_u^5$ (where u is from 0 to 2 and each $R^5$ is independently H or a $C_1$-$C_6$ alkyl group), $S(O)_x$ (where x is from 1 to 3), $PR_v^7$ (where v is from 0 to 3 and each $R^7$ is independently H, a $C_1$-$C_6$ alkyl group or a $C_6$-$C_{10}$ aryl group which may be substituted with one or more halogen, $C_1$-$C_4$ alkyl, $C_1$-$C_4$ alkoxy, or di-$C_1$-$C_4$ alkylamino groups) or $P(O)_y(R^6)_z$ (where y is from 1 to 3, z is 1 or 2, and each $R^6$ is independently H, phenyl or a $C_1$-$C_6$ alkyl group).

32. The material of claim 31, wherein $X^1$ and $X^2$ are independently at least one nanoparticle-binding member is selected from the group consisting of O, S, a carboxylate, a carboxylic acid group, and a —$CH_2CH_2$— group.

33. A method of making the material of claim 1, comprising the steps of
a) mixing nanoparticles of the formula $NP(X^1—R^1)_k$, where k is an integer greater than 1 and where NP, $X^1$ and $R^1$ are as defined in claim 1, with a molar excess of a compound of the formula $HX^2—R^2—Y$ or a salt thereof, where $X^2$, $R^2$ and Y are as defined in claim 1, in a reaction mixture; and
b) isolating and/or purifying said compound of the formula (1) from said reaction mixture.

34. The method of claim 33, further comprising mixing a Lewis base with said nanoparticles of the formula $NP(X^1—R^1)_k$ and said compound of the formula $HX^2—R^2—Y$ to promote a ligand exchange.

35. The method of claim 34, comprising mixing said nanoparticles and said compound in a solvent for a length of time sufficient to exchange at least a portion of the compound for sa ligands bound to paid nanoparticles and not having said photoreactive group or said group that is reactive with said photochemically generated species.

36. The method of claim 35, wherein said ligands bound to said nanoparticles and not having said photoreactive group or said group that is reactive with said photochemically generated species arc present in an excess molar amount with respect to said nanoparticles.

37. The method of claim 33, wherein said compound of the formula $H—X^2—R^2—Y$ or a salt thereof is present in at least 4 times the molar amount of said nanoparticles.

38. The method of claim 33, wherein $R^1—X^1$ is $R^1—C(═)—O—$, and $H—X^2—R^2—Y$ is $H—S—R^2—Y$.

39. A method of making the material of claim 1, comprising
a) either:
i) mixing nanoparticles of the formula $(R^1—X^1)_m NP(X^2—R^3—Z)_n$, where $R^3$ is any $R^2$ group, Z is a leaving group or electrophile, and NP, m, n, $X^1$, $X^2$, $R^1$ and $R^2$ are as defined in claim 21, with a compound of the formula H—Y, H—Nu—Y, H—Nu—$R^4$—Y or a salt of such compounds, where Nu is a conventional nucleophile and $R^4$ is $R^2$ minus $R^3$, and Y is as defined in claim 21, in a reaction mixture, or
ii) mixing nanoparticles of the formula $(R^1—X^1)_m NP(X^2—R^3—Nu—H)_n$ or a salt thereof with a compound of the formula Z—Y or Z—$R^4$—Y in a reaction mixture, where $R^1$, $R^3$, $R^4$, NP, in, n, $X^1$, $X^2$, Nu, Y and Z are as defined above; and
b) isolating and/or purifying said compound of the formula (1) from said reaction mixture.

40. The method of claim 39, wherein said nanoparticles have the formula $(R^1—X^1)_m NP(X^2—R^3—OH)_n$, $(R^1—X^1)_m NP(X^2—R^3—COOR^5)_n$, $(R^1—X^1)_m NP(X^2—R^3—NZ_2)_n$, or $(R^1—X)_m NP(X^2—R^3—SH)_n$, $X^2$ is independently a carboxylate, a carboxylic acid, —$NR_2^8$, —$N^+R_3^8$, an oxygen atom or sulfur atom, $R^8$ is H or alkyl, and $R^5$ is H or an ester protecting group.

41. The method of claim 39, wherein said mixing comprising mixing nanoparticles of the formula $(R^1—X^1)_m NP(X^2—R^3—Z)_n$, where NP consists essentially of a metal and $X^2$ is a carboxylate, a carboxylic acid or S, with said compound of the formula H—Nu—Y, H—Nu—$R^4$—Y or a salt thereof, where NuH is —$NHR^8$, OH or SH (except that NuH is OH when $X^2$ is said carboxylate or carboxylic acid) and $R^8$ is H or alkyl.

42. The method of claim 39, wherein NP consists essentially of silicon or a silicon-germanium mixture, $X^2$ is alkylene or O, and said compound of the formula H—Y, H—Nu—Y, or H—Nu—$R^4$—Y is either H—Nu—Y or H—Nu—$R^4$—Y, where H—Nu is COOH, $NHR^8$ or SH, and $R^8$ is H or alkyl.

43. The method of claim 39, comprising mixing nanoparticles of the formula $(R^1—X^1)_m NP(X^2—R^3—Z)_n$ with a compound of the formula H—Y or a salt thereof.

44. The method of claim 39, wherein Y is a cyamide, azide, hydroxide or sulfide anion.

45. The method of claim 39, comprising mixing nanoparticles of the formula $(R^1—X^1)_m NP(X^2—R^3—Nu—H)_n$ or a salt thereof with a compound of the formula Z—Y or Z—$R^4$—Y.

46. The method of claim 45, wherein Nu comprises a chalcogenide atom, a phenolate anion, an amine, a carboxylate or an aryl group, and said compound of the formula Z—Y or Z—$R^4$—Y comprises an aliphatic carboxylic acid anhydride, an allyl halide, or an aliphatic acyl chloride.

47. A method of making the material of claim 1, comprising the steps of
a) reacting nanoparticles of the formula $(R^1—X^1)_m NP(X^1—R^3—(CR═CR'R''))_k$, where k is an integer greater than 1, NP, $R^1$ and $X^1$ arc as defined in claim 21, $R^3$ is $R^2$ or a precursor thereof, and R, R' and R'' are independently H, $C_1$-$C_6$ alkyl, $C_2$-$C_6$ alkenyl, $C_1$-$C_6$ alkoxy, mono- or di-$C_1$-$C_6$ alkyl amino, a cyclic amino group, $C_6$-$C_{10}$ aryl (which may be substituted one or more times with $C_1$-$C_6$ alkyl, $C_2$-$C_6$ alkenyl, $C_1$-$C_6$ alkoxy, mono- or di-$C_1$-$C_6$ amino or halogen); —C(=O)O—$C_1$-$C_6$ alkyl or —C(=O)$C_1$-$C_6$ alkyl with an epoxidizing agent or source of $Y^+$, $Y^-$ or Y.; and b) isolating and/or purifying said compound of the formula (1) from said reaction mixture.

48. The method of claim 47, wherein R, R' and R" are independently H or $C_1$-$C_6$ alkyl.

49. The method of claim 47, wherein said reacting is with said epoxidizing agent.

50. The method of claim 47, wherein said reacting is with said $Y^+$ source and comprises electrophilically adding Y from Z—Y to the CR=CR'R" group.

51. The method of claim 47, wherein said reacting is with said $Y^+$ source and comprises electrophilically adding HY to the CR=CR'R" group.

52. The method of claim 47, wherein said reacting is with said Y. source and comprises radical addition of Y from HY or $Y_2$ to the CR=CR'R" group.

53. A radiation definable ink, comprising:
a) a radiation patternable functional material, comprising nanoparticles of an electronically functional substance selected from the group consisting of semiconductors and metals, and a plurality of ligands bound to each of said nanoparticles, said ligands containing a photoreactive group or a group that is reactive with a photochemically generated species and that, after first-order photoreaction or reacting with said photochemically generated species, materially changes the solubility characteristics of said material in a developer, wherein, after irradiation, developing and curing, the functional material forms a patterned film of an electronically conducting or semiconducting material; and
b) a solvent in which said material is soluble.

54. The ink of claim 53, further comprising a member of the group consisting of passivated nanoparticles and nanoparticles containing ligands not having a (photo)reactive group bound thereto.

55. The ink of claim 53, further comprising a source of said photochemically generated species.

56. The ink of claim 55, wherein said source of said photochemically generated species is selected from the group consisting of amides, photogenerated acid sources, photogenerated radical sources, carbonates, carbamates, and quinones.

57. The ink of claim 55, wherein said source of said photochemically generated species is an azide, and said group that is reactive with said photochemically generated species comprises said carbon-carbon double bond.

58. The ink of claim 55, wherein said source of said photochemically generated species is a photogenerated acid source, and said group that is reactive with said photochemically generated species is selected from the group consisting of an epoxide, an oxirane, an aziridine, and an activated carbon-carbon double bond.

59. The ink of claim 55, wherein said source of said photochemically generated species is a photogenerated radical source, and said group that is reactive with said photochemically generated species comprises an acrylate.

60. The ink of claim 53, wherein said ligands contain said photochemically reactive group, and said photochemically reactive group comprises a carbonate and/or a carbamate.

61. The ink of claim 53, wherein said photoreactive group comprises a quinone, and said ligand comprises a phenol.

62. The ink of claim 53, wherein said material is present in said ink in a percentage by weight of from 0.1% to 50%.

63. The ink of claim 53, wherein said solvent is selected from the group consisting of alkanes, alkenes, halogenated alkanes, halogenated alkenes, arenes, substituted arenes, alcohols, ethers, cyclic ethers, aliphatic ketones, aliphatic esters, aliphatic amides and aliphatic sulfoxides.

64. The ink of claim 63, wherein said solvent is selected from the group consisting of $C_6$-$C_{20}$ alkanes, $C_6$-$C_{20}$ alkenes, benzene which may be substituted with from 1 to 3 $C_1$-$C_4$ alkyl groups, $C_1$-$C_6$ aliphatic alcohols, $C_4$-$C_{20}$ ethers, $C_4$-$C_{20}$ polyethers, $C_4$-$C_{10}$ aliphatic ketones, and $C_1$-$C_6$ aliphatic esters of $C_2$-$C_{12}$ aliphatic carboxylic acids that may be substituted with from 1 to 3 halogen atoms or a $C_1$-$C_4$ alkoxy group.

65. The ink of claim 64, wherein said solvent comprises propylene glycol methyl ether acetate or ethyl ethoxypropionate.

66. The ink of claim 63, further comprising one or more additives selected from the group consisting of a tension reducing agent, a surfactant, a thickening agent and an adhesion promoter.

67. The ink of claim 66, further comprising said adhesion promoter.

68. The ink of claim 67, wherein said adhesion promoter comprises a $C_6$-$C_{20}$, branched or unbranched, mono- or polyunsaturated alkene; a $C_8$-$C_{18}$, branched or unbranched, substituted or unsubstituted mono- or polyunsaturated aralkene; a $C_4$-$C_{20}$, branched or unbranched, mono- or polyunsaturated alkenoic acid; a $C_1$-$C_{20}$ branched or unbranched aliphatic alcohol ester of a $C_2$-$C_{20}$, branched or unbranched aliphatic acid, wherein at least one of said aliphatic alcohol and said aliphatic acid contains at least 3 carbon atoms and at least one site of unsaturation; and/or a $C_4$-$C_{20}$, branched or unbranched, mono- or polyunsaturated aliphatic alcohol or aliphatic mercaptan.

69. A radiation definable ink, comprising:
a) the material of claim 1; and
b) a solvent in which said compound is soluble.

70. The ink of claim 69, further comprising a source of said photochemically generated species.

71. The ink of claim 70, wherein said source of said photochemically generated species is selected from the group consisting of azides, photogenerated acid sources, photogenerated radical sources and quinones.

72. The ink of claim 70, wherein said source of said photochemically generated species is an azide, and said group that is reactive with said photochemically generated species comprises said carbon-carbon double bond.

73. The ink of claim 70, wherein said source of said photochemically generated species comprises a photogenerated acid source, and said group that is reactive with said photochemically generated species is selected from the group consisting of an epoxide, an oxirane, an aziridine, and an activated carbon-carbon double bond.

74. The ink of claim 70, wherein said source of said photochemically generated species comprises a photogenerated radical source, and said group that is reactive with said photochemically generated species comprises an acrylate.

75. The ink of claim 69, wherein said ligands contain said photochemically reactive group, and said photochemically reactive group comprises a carbonate and/or a carbamate.

76. The ink of claim 69, wherein said compound is present in said composition in a percentage by weight of from 0.1% to 50%.

77. The ink of claim 69, further comprising one or more additives selected from the group consisting of a tension reducing agent, a surfactant, a thickening agent, and an adhesion promoter.

78. The ink of claim 77, further comprising said adhesion promoter.

79. The ink of claim 78, wherein said binder comprises a $C_6$-$C_{20}$, branched or unbranched, mono- or polyunsaturated alkene; a $C_9$-$C_{18}$, branched or unbranched, substituted or unsubstituted mono- or polyunsaturated aralkene; a $C_4$-$C_{20}$, branched or unbranched, mono- or polyunsaturated alkenoic acid; a $C_1$-$C_{20}$ branched or unbranched aliphatic alcohol ester of a $C_2$-$C_{20}$, branched or unbranched aliphatic acid, wherein at least one of said aliphatic alcohol and said aliphatic acid contains at least 3 carbon atoms and at least one site of unsaturation; and/or a $C_4$-$C_{20}$, branched or unbranched, mono- or polyunsaturated aliphatic alcohol or aliphatic mercaptan.

80. A method of making an electronically functional thin film, comprising the steps of:
   a) irradiating the ink of claim 53 to form an irradiated composition; and
   b) curing said irradiated composition to form said electronically functional thin film.

81. The method of claim 80, further comprising, after said irradiating step and before said curing step, the step of developing said irradiated composition to form a patterned thin film.

82. The method of claim 81, wherein said irradiating step comprises selectively irradiating portions of said composition, and said developing step comprises removing either irradiated or non-irradiated portions of said layer to form said patterned thin film.

83. The method of claim 82, wherein said selectively irradiating substep comprises (i) positioning at least one of said substrate and a mask such that said portions can be selectively irradiated and said non-irradiated portions cannot be irradiated, and (ii) irradiating said layer with ultraviolet light through said mask.

84. The method of claim 81, wherein said curing step comprises sintering said developed film to form a patterned electronically functional thin film.

85. The method of claim 81, wherein said curing step comprises heating said composition to a temperature of at least about 100° C. for a period of time sufficient to remove substantially all of said ligand(s).

86. The method of claim 85, wherein said curing temperature is at least about 200° C.

87. The method of claim 86, wherein said curing temperature is at least about 300° C.

88. The method of claim 87, wherein said curing temperature is at least about 400° C.

89. The method of claim 85, further comprising heating said electronically functional thin film to a temperature of at least about 200° C. in the presence of a reducing atmosphere to passivate said electronically functional thin film.

90. The method of claim 89, wherein said heating temperature is at least about 300° C.

91. The method of claim 81, wherein said patterned thin film comprises a two-dimensional array of lines having a width of from 100 nm to 100 µm.

92. The method of claim 91, wherein said lines have an inter-line spacing of from 100 nm to 100 µm.

93. The method of claim 92, wherein said lines have a length of from 1 µm to 5000 µm.

94. The method of claim 91, wherein said lines have a thickness of from 0.01 µm to 100 µm.

95. The method of claim 80, wherein said composition comprises metal or semiconductor nanoparticles having passivation thereon and/or containing ligands not having a (photo) reactive group bound thereto.

96. The method of claim 95, wherein said nanoparticles comprise metal nanoparticles.

97. The method of claim 80, further comprising depositing said composition on a substrate.

98. The method of claim 97, wherein said depositing comprises inkjetting, spin coating, dip coating, meniscus, extrusion or spray coating a solution, emulsion or suspension of said composition on said substrate.

99. The method of claim 80, wherein said curing step further comprises placing said substrate into a chamber, and evacuating said chamber.

100. The method of claim 99, wherein said curing step further comprises passing an inert and/or reducing gas into said chamber.

* * * * *